(12) United States Patent
Ohnuma

(10) Patent No.: US 6,370,441 B1
(45) Date of Patent: Apr. 9, 2002

(54) METHOD AND APPARATUS OF CORRECTING DESIGN-PATTERNED DATA, METHOD OF ELECTRON BEAM AND OPTICAL EXPOSURE, METHOD OF FABRICATING SEMICONDUCTOR AND PHOTOMASK DEVICES

(75) Inventor: Hidetoshi Ohnuma, Kanagawa (JP)

(73) Assignee: Sony Corporation, Tokyo (KP)

( * ) Notice: Subject to any disclaimer, the term of this patent is extended or adjusted under 35 U.S.C. 154(b) by 0 days.

(21) Appl. No.: 09/056,955

(22) Filed: Apr. 8, 1998

(30) Foreign Application Priority Data

Jun. 9, 1997 (JP) ............................................. 9-090767

(51) Int. Cl.[7] ............................................. G06F 19/00
(52) U.S. Cl. .......................... 700/121; 716/21; 716/19; 709/245; 709/227; 709/303; 709/304
(58) Field of Search ........................... 700/121; 716/21, 716/19; 395/500.2, 500.22; 382/144, 145, 146, 147, 148, 149, 150, 151; 709/245, 227, 303, 304

(56) References Cited

U.S. PATENT DOCUMENTS

| | | | |
|---|---|---|---|
| 5,046,012 A | * 9/1991 | Morishita et al. | 364/468.28 |
| 5,182,718 A | * 1/1993 | Harafuji et al. | 364/490 |
| 5,210,696 A | * 5/1993 | Yano | 364/488 |
| 5,253,182 A | * 10/1993 | Suzuki | 364/489 |
| 5,441,834 A | * 8/1995 | Takakuma et al. | 430/5 |
| 5,698,859 A | * 12/1997 | Haruki | 250/492.22 |
| 5,862,058 A | * 1/1999 | Samuels et al. | 364/491 |
| 5,885,734 A | * 3/1999 | Pierrat et al. | 430/5 |
| 5,969,801 A | * 10/1999 | Tsudaka | 355/55 |

FOREIGN PATENT DOCUMENTS

EP 0 529 971 A1 3/1993

OTHER PUBLICATIONS

Automated Optical Proximity Correction–A Rules Based Approach; Oberdan Otto et al. SPIE, vol. 2197, pp. 278–293.

Proximity Effect in Electron–Beam Lithography; T.H.P. Chang; J. Vac. Sci. Technol., vol. 12, No. 6, Nov./Dec. 1995; pp. 1271–1275.

Large–Area Optical Proximity Correction with a Combination of Rule–Based and Simulation–Based Methods; Sachiko Miyama et al.; Jpn. J. Appl. Phys. vol. 35 (1996) pp. 6370–6373.

* cited by examiner

Primary Examiner—David Wiley
Assistant Examiner—Firmin Backer
(74) Attorney, Agent, or Firm—Ronald P. Kananen; Rader, Fishman & Grauer

(57) ABSTRACT

A method for correcting designed-pattern data obtained by data-processing a plurality of designed patterns, comprising the steps of (a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

16 Claims, 13 Drawing Sheets

METHOD AND APPARATUS OF CORRECTING DESIGN-PATTERNED DATA, METHOD OF ELECTRON BEAM AND OPTICAL EXPOSURE, METHOD OF FABRICATING SEMICONDUCTOR AND PHOTOMASK DEVICES

BACKGROUND OF THE INVENTION AND RELATED ART

The present invention relates to a method of correcting designed-pattern data obtained by data-processing a plurality of designed patterns, a method of electron beam exposure including the method of correcting designed-pattern data, a photomask, a method of fabrication of a photomask, a method of optical exposure, a semiconductor device, a method of fabrication of a semiconductor device, and an apparatus for correcting designed-pattern data.

A photomask used in the process of optical lithography for the fabrication of a semiconductor device has a structure in which a patterned light-shielding thin layer or light semi-shielding thin layer is formed on a substrate transparent to exposure light, such as a glass substrate. In the fabrication of the semiconductor device, it is required to transfer a pattern formed in the photomask to a photo resist formed, e.g., on a semiconductor substrate. For this purpose, it is required to produce data from a plurality of designed patterns designed by means of CAD or the like and expose an electron beam resist formed on a mask blank with an electron beam (electron beam exposure) on the basis of pattern data for electron beam exposure prepared from the produced data so that patterns corresponding to the designed patterns are faithfully formed in the electron beam resist. In some case hereinafter, patterns formed in a photomask will be referred to as "mask patterns", pattern data obtained by data-processing a plurality of the designed patterns will be referred to as "designed-pattern data", pattern data for electron beam exposure will be referred to as "pattern data for exposure", patterns formed in an electron beam resist will be referred to as "resist patterns", and patterns formed in a photo resist will be referred to as "printed patterns". For example, the designed-pattern data for fabricating a photomask is constituted of a steam format called GDSII/Stream in which the designed patterns are represented by polygons or of an electron beam data format ("EB data format" hereinafter) in which the designed patterns are represented by rectangles and trapezoids.

Meanwhile, in electron beam exposure, a phenomenon called "proximity effect" controls the limitation of resolution for forming mask patterns, and it is a big problem when a photomask requiring micro- or nano-processing is fabricated. The above proximity effect takes place by scattering of electrons in a solid, and it can be classified into two categories depending upon the shapes and/or geometrical layouts of the mask patterns to be formed. That is, it is classified into an intra proximity effect which takes place in an isolated small mask pattern and an inter proximity effect which takes place between adjacent mask patterns. In the intra proximity effect, electrons incident on an electron beam resist are scattered into portions of the electron beam resist other than portions of the electron beam resist where resist patterns are to be formed. As a result, accumulated energy in the portion of the electron beam resist where resist patterns are to be formed cannot reach a predetermined threshold value, so that the sizes of the resist patterns are smaller than those of their designed patterns, or that corner portions of the resist patterns are rounded to some extent. On the other hand, in the inter proximity effect, accumulated energy in resist patterns to be formed in an electron beam resist reaches a predetermined threshold value due to the scattering of electrons from resist pattern(s) close or adjacent thereto, and the resist patterns have larger dimensions than their designed patterns or, in the worst case, resist patterns are in contact with another. In the direct exposure of an electron beam resist formed on a semiconductor substrate with an electron beam, the proximity effect similarly causes the above problems.

For correcting the proximity effect with regard to an electron beam exposure apparatus according to a variable shaped beam method, there is proposed a method in which electron beam dosages ("dosage", hereinafter) are varied depending upon each resist pattern to be formed in an electron beam resist. In the above method, evaluation points (indicated by black dots) are provided on edges of a designed pattern as schematically shown in FIG. 10A, accumulated energy determined on the basis of the EID (Exposure Intensity Distribution) function proposed by T. H. P. Chang, J. Vac. Soi. Technol. 12, 1271 (1983) is calculated with regard to each evaluation portion, and an optimum dosage for forming a resist pattern is determined. However, when geometrical layouts of adjacent designed patterns in the vicinity of the evaluation points differ, one obtained optimum dosage in one evaluation point differs from another obtained optimum dosage in another evaluation point, and eventually, a weighted mean dosage is inevitably determined to be an optimum dosage. Accuracy is therefore different from one evaluation point to another, or no desired accuracy is secured in some cases. For overcoming the above defect, it is required to divide a designed pattern as shown in FIG. 10B and control the dosage with regard to each evaluation point. Numerals in FIGS. 10A and 10B show the dosages. However, when all of designed patterns are divided to smaller sizes, the time required for calculation of the proximity effect correction increases, and the file size (data volume) of the designed-pattern data or the time required for electron beam exposure increases. The consequent problem is that the fabrication of a photomask takes a long time.

On the other hand, even if the proximity effect correction is carried out to form the mask patterns in order to accurately transfer the designed patterns to a photo resist, there is another problem that an optical proximity effect takes place when the mask patterns are transferred to a photo resist formed, e.g., on a semiconductor substrate by means of exposure light through the photomask, so that the shapes of the patterns formed in the photo resist (printed patterns) differ from those of their designed patterns. That is, the optical exposure process in the production process of a semiconductor device has the problem of an optical proximity effect. That is, when a mask pattern whose size approximates a wavelength of the exposure light is transferred to a photo resist, an interference phenomenon with the exposure light remarkably takes place, and a printed pattern differs from its designed pattern in size. The optical proximity effect results in phenomena in which a line width of an isolated line differs from a line width of a repetitive line and in which line-end shortening occurs, and it causes the deterioration of gate line width controllability or a decrease in an alignment margin. As a result, transistors vary in characteristics, and eventually, the yield of chip production decreases. The optical proximity effect has extremely detrimental effects on the efficiency of production of semiconductor devices. Since the above problem is fatal particularly to memory cells which have many repetitive patterns and are required to have high-degree integration, there has been developed an advanced automatic optical proximity effect correction (OPC) system on the basis of a light intensity simulation for memory cells which come after the generation of design rule 0.35 μm.

The optical proximity effect is also classified into an intra optical proximity effect and an inter optical proximity effect. In the intra optical proximity effect, the exposure light diffracts in a mask pattern itself, and as a result, the dimensions of a pattern formed in a photo resist by focusing the exposure light on the photo resist differ from those of its designed pattern, or, for example, the short side and the long side of a rectangle differ to a great extent in formation accuracy. On the other hand, in the inter optical proximity effect, exposure light which diffracts from a mask pattern adjacent to some other mask pattern interferes with exposure light which passes through the other mask pattern, and as a result, the dimensions of the other pattern formed in the photo resist differ from those of its designed pattern.

Further, the optical proximity effect results in variation of the line widths of isolated lines or line-end shortening in memory peripheral circuit patterns or random circuit patterns in one chip of an ASIC semiconductor device. As a result, it causes a decrease in the yield of production due to an adverse influence on transistor characteristics or a decrease in an alignment margin. However, when the optical proximity effect correction is carried out on the random circuit patterns on a one-chip scale by means of the OPC system on the basis of a light intensity simulation, it requires an enormous amount of calculation time and affects a turn around time (TAT) from the designing of one chip to the fabrication of semiconductor devices. That is, the calculation of the optical proximity effect correction on a cell unit having a size of about several μm×several μm takes a time of about ten seconds, while the calculation of the optical proximity effect correction on one chip as a whole takes a time of hundreds of days.

For coping with the above problem, there is proposed a method in which the optical proximity effect correction is carried out on one-chip level by a rule-based method in which the corrections are made only on the designed patterns having shapes within a certain limit at a high speed on the basis of a predetermined rule. Please refer, for example, to "Automated Optical Proximity Correction—a rule-based approach", O. W. Otto, et al., Proc. SPIE, Vol. 2197 (1994) pp. 274–290, or "Large Area Optical Proximity Correction with a Combination of Rule-Based and Simulation-Based Methods", S. Miyama, et al., Jpn. J. Appl. Phys. Vol. 35(1996) pp. 6370–6773.

FIG. 11 shows an example of the flow of formation of the pattern data for exposure when the designed-pattern data is of a stream format. In this example, the designed-pattern data are bit-mapped, and then the optical proximity effect correction is carried out on the bit-mapped data to obtain the designed-pattern data corrected with regard to the optical proximity effect. The obtained designed-pattern data is of stream format, and the obtained designed-pattern data of the above format is converted to designed-pattern data of EB data format by a known method. And, the pattern data for exposure are prepared from the designed-pattern data of EB data format which are corrected with regard to the optical proximity effect. Bit-mapped data will be sometimes referred to as "bitmap data" hereinafter.

FIG. 12A shows results of studies of an influence of the optical proximity effect by a light intensity simulation, depending upon the density of designed patterns. In FIG. 12A, an upper portion schematically shows the designed patterns, and a lower portion schematically shows the printed patterns. FIG. 12B shows results after the optical proximity effect correction is carried out. In FIG. 12B, an upper portion schematically shows the designed patterns after the optical proximity effect correction, and a lower portion schematically shows the printed patterns. FIGS. 12A and 12B show that the variation of the line widths between the isolated line and the dense line is decreased by carrying out the optical proximity effect correction.

Meanwhile, for the above-explained proximity effect correction or optical proximity effect correction, it is required to determine the optimum dosages for the designed patterns or correct the shapes of the designed if patterns. More specifically, when the pattern data for exposure is prepared from the designed-pattern data, e.g., for a semiconductor device, it is required to correct the designed-pattern data with regard to the proximity effect and/or the optical proximity effect. For this purpose, it is required to search the designed-pattern data on the designed patterns which are adjacent to each other and to correct the searched designed-pattern data. Those pieces of information that are required for the proximity effect correction and/or the optical proximity effect correction are the sizes of the designed patterns which are required to be corrected and the space widths between said designed patterns and adjacent designed patterns thereto.

Further, when the designed-pattern data is of stream format, some designed patterns overlap with each other, and some data processing is therefore required. When the designed-pattern data is of EB data format, the designed patterns do not overlap with each other, while pattern fracturing or field partition is present depending upon an electron beam exposure apparatus, and some data processing is therefor required for obtaining the above information. The term "pattern fracturing" refers to a state where one designed pattern for forming one mask pattern is fractured into a plurality of designed patterns. Therefore, the following is required. For example, the designed patterns are determined on whether they are in contact with one another, the designed patterns in contact with each other are stored in a memory as a combined designed pattern, and finally, dimensions of the combined designed pattern and a space width between the combined designed pattern and an adjacent designed pattern are determined. The above processing requires the search of the adjacent designed patterns, and when the number of the designed patterns is n, therefore, the processing time suffers an increase of the order of $n^2$ in the worst case.

Otherwise, conventionally, designed-pattern data are bit-mapped with a minimum grid size being used as a unit, which state is schematically shown in FIG. 13A. The contents of first to 12th bitmap data are "0", the contents of 13th to 32nd bitmap data for a designed pattern A are "1", the contents of 33rd to 53rd bitmap data are "0", the contents of 54th to 62nd bitmap data for a designed pattern B are "1", and the contents of 63rd and 64th bitmap data are "0". The dimension of the designed pattern is determined by deducting the bitmap data for coordinate values showing one edge portion of the designed pattern from the bitmap data for coordinate values showing the other edge portion. Further, a space width between one designed pattern and an adjacent designed pattern can be determined by deducting the bitmap data for coordinate values showing one edge portion of one adjacent designed pattern from the bitmap data for coordinate values showing one edge portion of the other designed pattern. When two designed patterns overlap, for example, as schematically shown in FIG. 13B, obtained bitmap data represents one designed pattern. That is, when one edge portion of one designed pattern overlap, or is continued from, one edge portion of the other adjacent designed pattern, these designed patterns can be represented as continuous bitmap data. This bit-mapping method is called "area-bitmapping method". In the bitmap data obtained by the above area-bitmapping method, the overlapping of the designed patterns is removed, or in the area-bitmapping method, it is no longer necessary to remove the overlapping of the designed patterns.

In the above area-bitmapping method, however, it is required to bit-map all of the designed patterns while using a minimum grid size as a unit, the bitmap data are enormous in volume, and it is required to search the designed patterns with regard to all of the bitmap data. There is therefore a problem that the proximity effect correction and/or the optical proximity effect correction take a long time, and that a memory used is enormous.

OBJECT AND SUMMARY OF THE INVENTION

It is therefore an object of the present invention to provide a method of correcting designed-pattern data, including a method capable of determining line widths and space widths of designed patterns at a practical speed, for improving the conventional area-bitmapping method and for correcting the designed-pattern data with regard to the proximity effect and/or the optical proximity effect.

It is further another object of the present invention to provide a method of electron beam exposure, a photomask, a method of fabrication of a photomask, a method of optical exposure, a semiconductor device, a method of fabrication of a semiconductor device and an apparatus for correcting designed-pattern data, including the method of correcting designed-pattern data.

For achieving the above object, the method for correcting designed-pattern data obtained by data-processing a plurality of designed patterns, provided by the present invention, comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The method of electron beam exposure, provided by the present invention for achieving the above object, comprises the steps of;

correcting designed-pattern data obtained by data-processing a plurality of designed patterns, preparing pattern data for electron beam exposure from the corrected designed-pattern data, and exposing an electron beam resist formed on a substrate with an electron beam on the basis of the obtained pattern data for electron beam exposure, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The method of fabrication of a photomask, provided by the present invention for achieving the above object, comprises the steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The photomask, provided by the present invention for achieving the above object, is a photomask obtained by the fabricating steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The method of optical exposure, provided by the present invention for achieving the above object, comprises the step of exposing a photo resist formed on a substrate through a photomask with exposure light to transfer a pattern formed in the photomask to the photo resist formed on the substrate, said photomask obtained by the fabricating steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The method of fabricating a semiconductor device, provided by the present invention for achieving the above object, comprises the steps of (1) exposing a photo resist formed on a substrate through a photomask with exposure light to transfer a pattern formed in the photomask to the photo resist formed on the substrate, (2) developing the photo resist to obtain an etching mask, and (3) etching the substrate with the etching mask, said photomask obtained by the fabricating steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The semiconductor device, provided by the present invention for achieving the above object, is a semiconductor device obtained by the fabricating steps of (1) exposing a photo resist formed on a substrate through a photomask with exposure light to transfer a pattern formed in the photomask to the photo resist formed on the substrate, (2) developing the photo resist to obtain an etching mask, and (3) etching the substrate with the etching mask, said photomask obtained by the fabricating steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

The designed-pattern data is corrected with regard to the proximity effect, with regard to the optical proximity effect or with regard to the proximity effect and the optical proximity effect.

The substrate used in the method of electron beam exposure according to the present invention includes, for example, a mask blank obtained by forming a light-shielding thin layer or light semi-shielding thin layer of metal or metal oxide (the thin layer may have a single-layered structure or a multi-layered structure) on a glass substrate transparent to the exposure light, such as soda-lime glass, low-expansion glass or synthetic quartz glass.

In the method of electron beam exposure, the method of optical exposure, the semiconductor device or the method of fabrication of the semiconductor device, provided by the present invention, the substrate includes a semiconductor substrate, a semi-insulated or insulated substrate, or a layer which is formed on any one of these substrates and is to be treated. The layer to be treated specifically includes a polysilicon layer doped with an impurity; a layer of metal such as aluminum alloy, tungsten, copper or silver; a layer of metal compound such as tungsten silicide or titanium silicide; a stacked structure layer formed of a polysilicon layer doped with an impurity and a layer of metal compound such as tungsten silicide or titanium silicide; a stacked structure layer formed of a polysilicon layer doped with an impurity, a layer of metal compound such as tungsten silicide or titanium silicide and an insulation layer; and an insulation layer. The above insulation layer refers to an insulation layer formed of a known insulation material such as $SiO_2$, BPSG, PSG, BSG, AsSG, SbSG, NSG, SOG, LTO (lower temperature oxide, low temperature CVD-$SiO_2$), SiN or SiON, or a stacked structure layer formed of any two or more materials of these.

The photomask provided by the present invention, the photomask fabricated by the method of fabrication of the photomask provided by the present invention, the photomask used in the method of optical exposure provided by the present invention, the photomask used in fabricating the semiconductor device provided by the present invention, or the photomask used in the method of fabrication of the semiconductor device provided by the present invention, includes a general exposure mask in which patterns of a light-shielding thin layer are formed, a phase shift mask, and a half tone method phase shift mask in which patterns of a light semi-shielding thin layer are formed.

In the method of optical exposure, the semiconductor device or the method of fabrication thereof, provided by the present invention, the photomask for use with exposure light may be a photomask prepared by etching the mask blank with the etching mask obtained by developing the electron beam resist (i.e., master mask), or it may be a working mask prepared by copying the master mask.

In the method of correcting designed-pattern data, the method of electron beam exposure, the photomask, the method of fabrication of the photomask, the method of optical exposure, the semiconductor device or the method of fabrication of the semiconductor device, provided by the present invention, the hierarchical-area-bitmapping procedure in the above step (a) may include;

(A) bitmapping the designed-pattern data concerning a predetermined area including the deigned pattern, on the basis of a first grid size, to produce a bitmap data on a first grid size level, and (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

When the bitmap data obtained on the basis of the m-th grid size represents the coordinate value expressing the edge of the designed pattern, it is no longer necessary to produce bitmap data on the basis of the (m+1)-th grid size. For the procedure of hierarchical-area-bitmapping itself, please refer to "Layout Design and Verification", T. Otsuki, et al., North Holland (1986), pp. 250–251.

The apparatus for correcting designed-pattern data obtained by data-processing a plurality of designed patterns, provided by the present invention for achieving the above object, comprises;

(1) inputting means for inputting the designed-pattern data, (2) producing means for producing bitmap data, (3) determining means for determining a line width of the designed pattern and a space width between said designed pattern and a designed pattern adjacent to said designed pattern, (4) correcting means for correcting the designed-pattern data, and (5) outputting means for outputting the corrected designed-pattern data, wherein said producing means is for producing hierarchical-area-bitmapped bitmap data from the designed-pattern data, said determining means is for determining a line width of the designed pattern and a space width between the designed pattern and a designed pattern adjacent to said designed pattern on the basis of said hierarchical-area-bitmapped bitmap data, and said correcting means is for correcting the designed-pattern data on the basis of the determined line width and the determined space width, for proximity effect correction and/or optical proximity effect correction.

In the apparatus for correcting designed-pattern data, provided by the present invention, preferably, said producing means is preferably for;

(A) bitmapping the designed-pattern data concerning a predetermined area including the deigned pattern, on the basis of a first grid size, to produce a bitmap data on a first grid size level, and (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

When the bitmap data obtained on the basis of the m-th grid size represents the coordinate value expressing the edge of the designed pattern, it is no longer necessary to produce bitmap data on the basis of the (m+1)-th grid size.

In the present invention, when the designed patterns of a semiconductor device are searched for one chip as a whole, the hierarchical-area-bitmapped bitmap data are produced from the designed-pattern data, and the hierarchical-area-bitmapped bitmap data are used for determining the line widths and the space widths of the designed patterns. Even when a stream format is used as designed-pattern data, therefore, it is no longer necessary to check whether or not the designed patterns overlap or are in contact. On the other hand, when EB data format is used, pattern fracturing or field partition is present. However, by producing the hierarchical-area-bitmapped bitmap data from the designed-pattern data, it is no longer necessary to consider the pattern fracturing or the field partition. Further, unlike prior art methods, it is no longer necessary to produce bitmap data from all of the designed patterns on the basis of the minimum grid size, and the file size (data volume) of the bitmap data is decreased by the hierarchical-area-bitmapping. As a consequence, the designed patterns for one chip as a whole can be searched at a practical speed to determine the line widths and the space widths of the designed patterns.

BRIEF DESCRIPTION OF THE DRAWINGS

The present invention will be explained concerning examples with reference to drawings.

EXAMPLE 1

Figure 1:
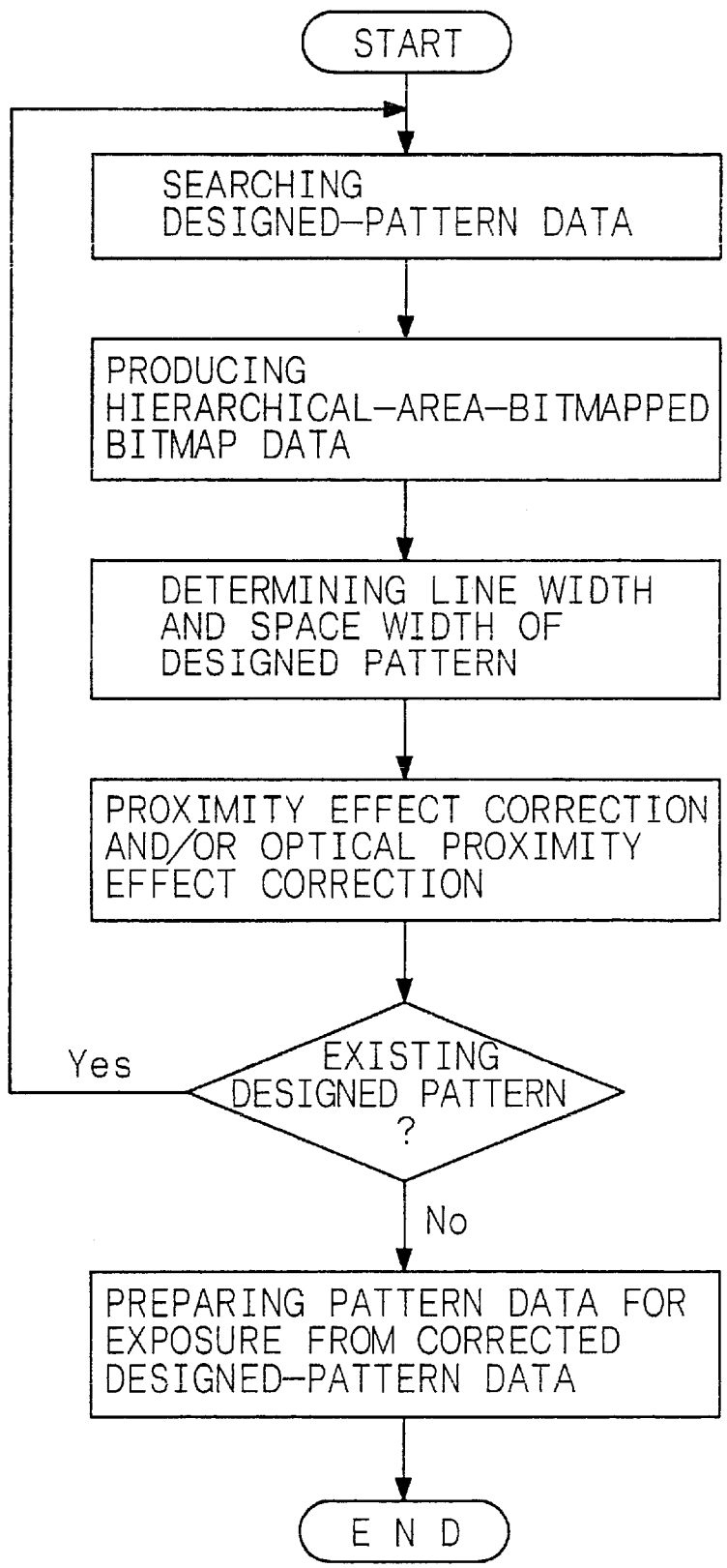
FIG. 1 is a flow chart of Example 1 which includes the method of correcting designed-pattern data and shows the preparation of pattern data for electron beam exposure from the designed-pattern data.

Example 1 is concerned with a method of correcting designed-pattern data obtained by data-processing a plurality of designed patterns used for fabricating, for example, a semiconductor device, which method comprises the steps of (a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction. FIG. 1 shows a flow chart of the preparation of pattern data for electron beam exposure (pattern data for exposure) from the designed-pattern data, including the method of correcting designed-pattern data.

Figure 2A:
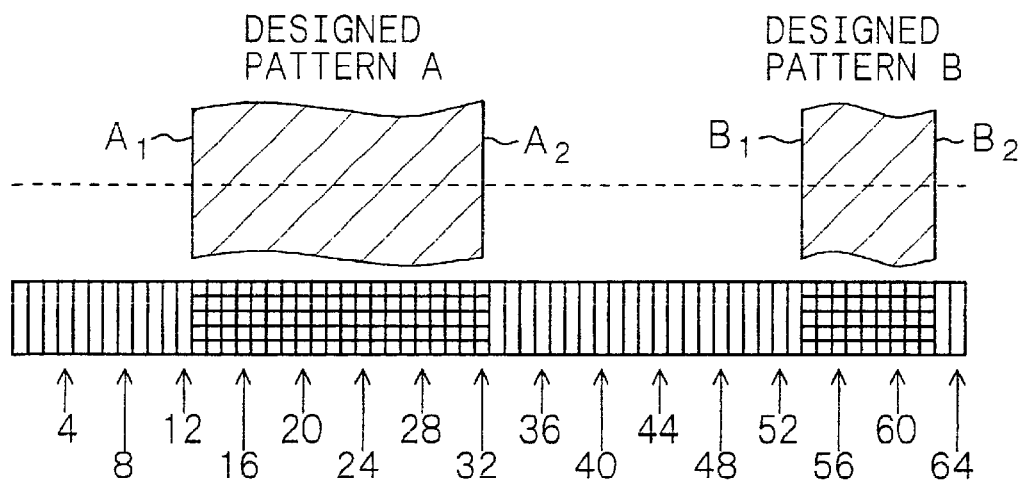
FIGS. 2A and 2B schematically show designed patterns and bitmap data for explaining the hierarchical-area-bitmapping.
Figure 2B:
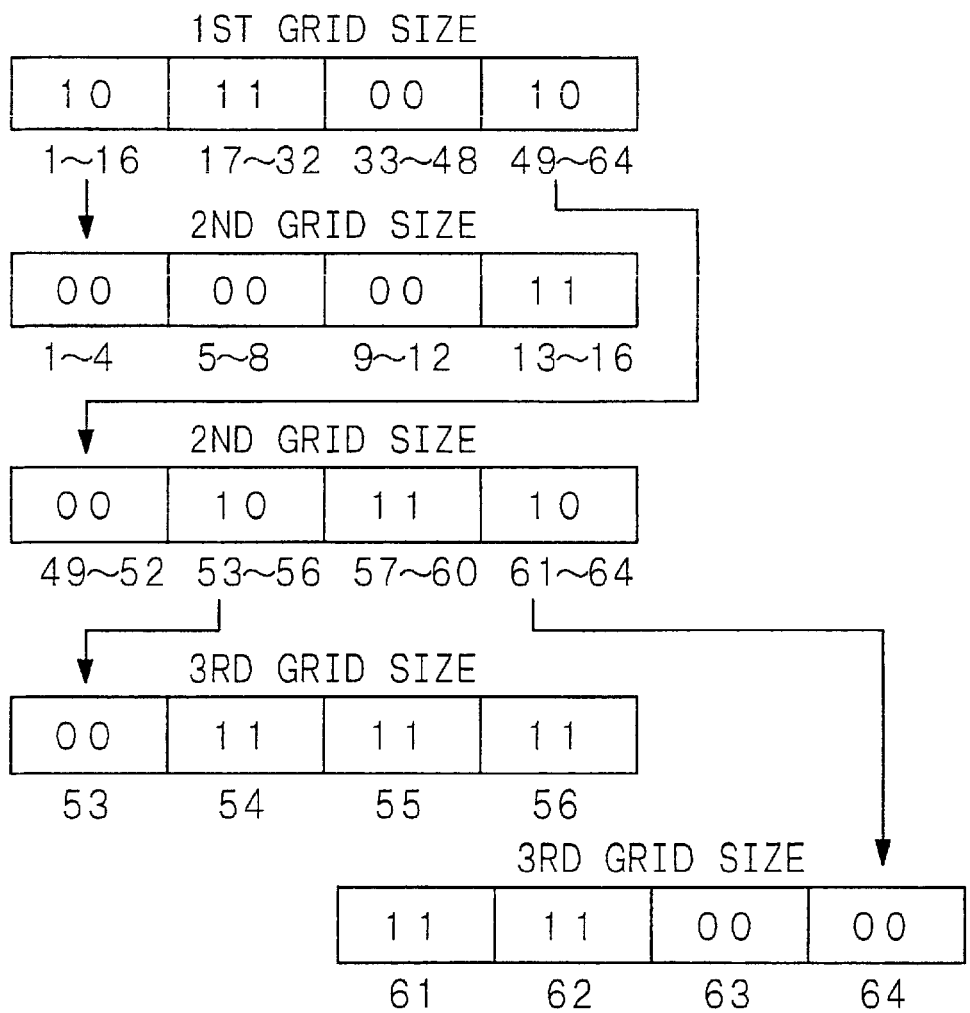

The hierarchical-area-bitmapping procedure will be explained with reference to FIGS. 2A and 2B hereinafter. For example, when expressed in terms of bitmap data with a minimum grid size as a unit, one edge portion $A_1$ of a designed pattern A is positioned between 12th bitmap data and 13th bitmap data, and one edge portion $B_1$ of a designed pattern B is positioned between 53rd bitmap data and 54th bitmap data as shown in FIG. 2A. On the other hand, the other edge portion $A_2$ of the designed pattern A is positioned between 32nd bitmap data and 33rd bitmap data, and the other edge portion $B_2$ of the designed pattern B is positioned between 62nd bitmap data and 63rd bitmap data. That is, when the minimum grid size is used as a unit, bitmap data showing coordinate values for the edge portions $A_1$ and $A_2$ of the designed pattern A are the 13th bitmap data and the 32nd bitmap data, respectively. On the other hand, bitmap data showing coordinate values for the edge portions $B_1$ and $B_2$ of the designed pattern B are the 54th bitmap data and the 62nd bitmap data, respectively. Each bitmap data is composed of, for example, 2-bit bytes.

Further, when bitmap data expresses only a region where no designed pattern is present, for example, "00" is written in as a content of the bitmap data. When bitmap data expresses only a region where a designed pattern is present, for example, "11" is written in as a content of the bitmap data. When bitmap data one level lower in the hierarchy is present, for example, "10" is written in as a content of the bitmap data. In other words, bitmap data including information of an edge portion of a designed pattern has a content of "10", and it is required to produce bitmap data one level lower in hierarchy, i.e., bitmap data on an (m+1)-th grid size level, from the above bitmap data on an m-th grid level having a content of "10". When the contents of continuous bitmap data change from "00", to "11" or from "11" to "00", the bitmap data having a content of "11" expresses a coordinate value for an edge portion of a designed pattern. In explanations to be give below, N-th bitmap data obtained on the basis of an m-th grid size is referred to as "$D_{m\_N}$". Further, a parenthesized value in a subscript, for example, (m'_N') shows superordinate bitmap data including the bitmap data $D_{m\_N}$, where m' means an m'-th grid size in which an m+-th grid size is larger than the m-th grid size and N' means N'-th bitmap data.

The method of correcting designed-pattern data in Example 1 will be explained below.

[Step-100]

First, the designed-pattern data is searched. In the hierarchical-area-bitmapping procedure, first, the designed-pattern data concerning a predetermined region including the designed pattern is bitmapped on the basis of a first grid size, to produce a bitmap data on a first grid size level. The above bitmapping procedure is carried out, for example, unidimensionally on the designed patterns. That is, the designed-pattern data are searched, and, judgement of whether or not a designed pattern is present along a dotted line shown in FIG. 2A, which dotted line passes, for example, a centroid of the designed pattern, is carried out on the searched designed-pattern data. The first grid size corresponds to a size, e.g., 16 times as large as the minimum grid size. In the first grid size, as shown in FIG. 2B, "10", is written as a first bitmap data, "11" is written as a second bitmap data, "00" is written as a third bitmap data, and "10" is written as a fourth bitmap data. That is, the contents of the bitmap data are as shown in Table 1. In Table 1, numerals on the right hand side stand for bitmap data number which are included in bitmap data on the m-th grid size and are to be indicated when the minimum grid size is a unit. These numerals are used in this sense hereinafter.

TABLE 1

| bitmap data | |
|---|---|
| $D_{1\_1}$(10) | 1 to 16 |
| $D_{1\_2}$(11) | 17 to 32 |
| $D_{1\_3}$(00) | 33 to 48 |
| $D_{1\_4}$(10) | 49 to 64 |

[Step-110]

Then, bitmap data on an (m+1)-th grid size level are produced from a bitmap data on an m-th grid size level which includes an edge of the designed pattern and is included among a plurality of bitmap data on an m-th grid size level obtained on the basis of an m-th grid size, where m=1, 2, 3 . . . M, M is a minimum grid size representing coordinate value, and an (m+1)-th grid size is smaller than an m-th grid size. In Example 1, M=3, while the value of M shall not be limited thereto in the method of correcting designed-pattern data in the present invention.

Specifically, bitmap data on a second grid size level on the basis of the second grid size are produced from the bitmap data on the first grid size level which includes an edge portion of the designed pattern and is included in bitmap data obtained on the basis of the first grid size. That is, the bitmap data are produced, on the basis of a second grid size, from the bitmap data having a content of "10", i.e., the first bitmap data $D_{1\_1}$ and the fourth bitmap data $D_{1\_4}$. The second grid size corresponds to a size, e.g., four times as large as the minimum grid size. The bitmap data produced on the basis of the second grid size, from the bitmap data on the basis of the first grid size are as shown in the following Table 2. When the bitmap data obtained on the basis of the first grid size represents the coordinate value expressing the edge of the designed pattern, it is no longer necessary to produce bitmap data, i.e., it is no longer necessary to produce bitmap data on the basis of the second grid size concerning the second bitmap data $D_{1\_2}$.

TABLE 2

| Concerning $D_{1\_1}(10)$: | |
| --- | --- |
| $D_{2\_1(1\_1)}(00)$ | 1 to 4 |
| $D_{2\_2(1\_1)}(00)$ | 5 to 8 |
| $D_{2\_3(1\_1)}(00)$ | 9 to 12 |
| $D_{2\_4(1\_1)}(11)$ | 13 to 16 |
| Concerning $D_{1\_4}(10)$: | |
| $D_{2\_1(1\_4)}(00)$ | 49 to 52 |
| $D_{2\_2(1\_4)}(10)$ | 53 to 56 |
| $D_{2\_3(1\_4)}(11)$ | 57 to 60 |
| $D_{2\_4(1\_4)}(10)$ | 61 to 64 |

Further, the above procedure is repeated by incrementing m by 1 until the bitmap data obtained on the basis of the (m+1)-th grid size represents the coordinate value expressing the edge of the designed pattern. That is, when a bitmap data having a content of "10" is present, Step-110 is repeated by incrementing m by 1. Specifically, the bitmap data $D_{2\_2(1\_4)}(10)$ and the $D_{2\_4(1\_4)}(10)$ having a content of "10" each are selected to produce bitmap data on the basis of a third grid size. The third grid size is, for example, the minimum grid size. When the bitmap data on the basis of the third grid size are produced from the bitmap data on the basis of the second grid size, the produced bitmap data are as shown in the following Table 3. When the bitmap data obtained on the basis of the second grid size represents the coordinate value expressing the edge of the designed pattern, it is no longer necessary to produce bitmap data, i.e., it is no longer necessary to produce bitmap data on the basis of the third grid size concerning the fourth bitmap data $D_{2\_4(1\_1)}$ concerning $D_{1\_1}(10)$.

TABLE 3

| Concerning $D_{2\_2(1\_4)}(10)$: | |
| --- | --- |
| $D_{3\_1(2\_2)(1\_4)}(00)$ | 53 |
| $D_{3\_2(2\_2)(1\_4)}(11)$ | 54 |
| $D_{3\_3(2\_2)(1\_4)}(11)$ | 55 |
| $D_{3\_4(2\_2)(1\_4)}(11)$ | 56 |
| Concerning $D_{2\_4(1\_4)}(10)$: | |
| $D_{3\_1(2\_4)(1\_4)}(11)$ | 61 |
| $D_{3\_2(2\_4)(1\_4)}(11)$ | 62 |
| $D_{3\_3(2\_4)(1\_4)}(00)$ | 63 |
| $D_{3\_4(2\_4)(1\_4)}(00)$ | 64 |

According to the above-explained hierarchical-area-bitmapping procedure, it is sufficient to use 20 bitmap data for expressing regions where designed patterns are present in regions corresponding to the first to 64th bitmap data on the basis of the minimum grid size. In the conventional area-bitmapping method, the number of bitmap data is 64. Therefore, the size of bitmap data can be remarkably decreased by producing hierarchical-area bitmapped bitmap data from designed-pattern data. As a result, data can be searched at a high speed, and further, the required size (capacitance) of a memory or a storage medium can be decreased.

A line width of a designed pattern and a space width between the designed pattern and another designed pattern adjacent thereto can be easily determined from the above-obtained hierarchical-area-bitmapped bitmap data. For example, the line width of the designed pattern A shown in FIG. 2A can be obtained by conducting an operation based on the bitmap data of $D_{1\_2}$ and $D_{2\_4(1\_1)}$ (reduction of bitmap data by taking a grid size into account). Further, the line width of the designed pattern B can be obtained by conducting an operation based on the bitmap data of $D_{3\_2(2\_4)(1\_4)}$ and $D_{3\_2(2\_2)(1\_4)}$. Further, the space width between the designed pattern A and the designed pattern B can be obtained by conducting an operation based on the bitmap data of $D_{3\_2(2\_2)(1\_4)}$ and $D_{1\_2}$.

Figures 3A, 3B:
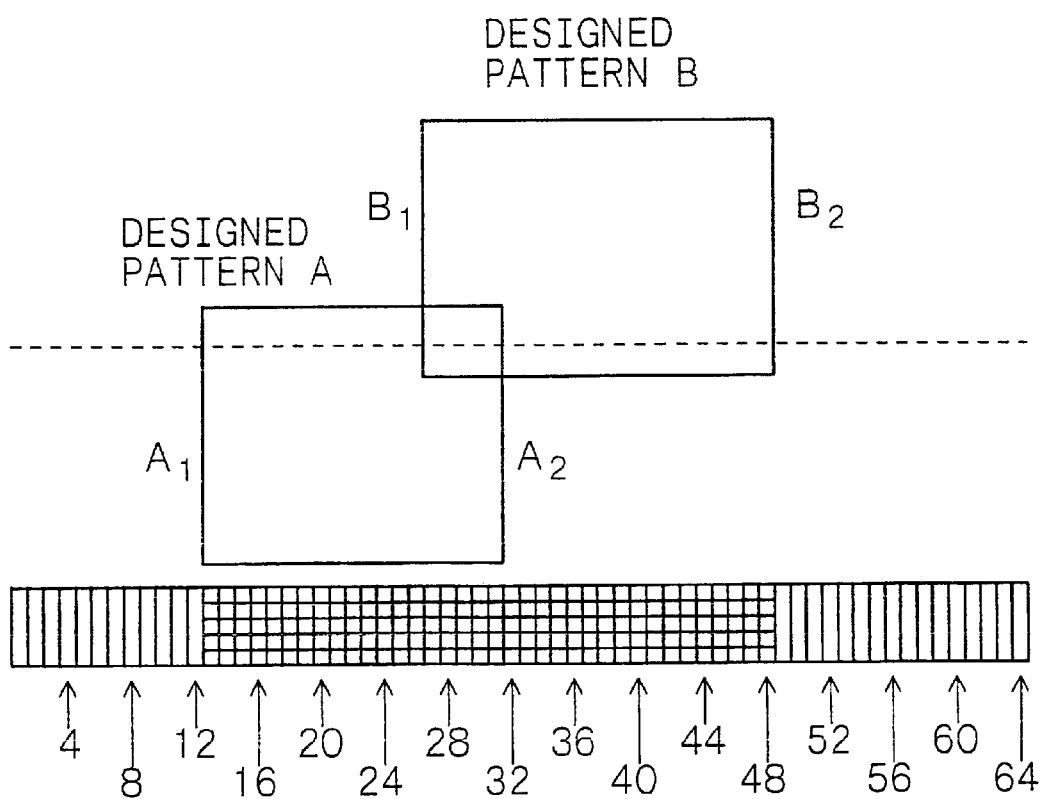
FIGS. 3A and 3B schematically show designed patterns and bitmap data for explaining the hierarchical-area-bitmapping when the designed patterns overlap.

In the hierarchical-area-bitmapping, obtained bitmap data show one pattern when designed-pattern data is of stream format and even when designed patterns overlap as shown in FIGS. 3A. FIGS. 3A and 3B show only bitmap data obtained by judging whether or not a designed pattern is present along a dotted line unidimensionally and by bitmapping the designed-pattern data on the basis of a first grid size. That is, even when the designed-pattern data is of stream format, the overlapping of designed patterns is removed from the bitmap data. In a prior art, for example, designed-pattern data are subjected to graphic operation, and then the pattern data for exposure is prepared. In the hierarchical-area-bitmapping procedure in the present invention, since the overlapping of designed patterns is omitted in terms of bitmap data, an overhead between the graphic operation and the correction with regard to the proximity effect or the optical proximity effect can be decreased.

[Step-120]

And, the designed-pattern data is corrected on the basis of the obtained line width and space width of the designed pattern, for the proximity effect correction and/or the optical proximity effect correction. That is, when a correction rule corresponding to line widths and space widths of designed patterns with regard to the proximity effect and/or the optical proximity effect is determined in advance by simulations or experiments, the correction rule is applied to the obtained line widths and the space widths of the designed patterns in order to carry out the proximity effect correction and/or the optical proximity effect correction for the designed patterns, whereby the corrected designed-pattern data can be obtained. Otherwise, a light intensity simulation is conducted on the basis of the obtained line width and space width of the designed pattern, and the designed patterns are corrected with regard to the optical proximity effect, whereby the designed-pattern data corrected with regard to the optical proximity effect can be obtained.

The method of correction with regard to the proximity effect includes a method of modifying the shape of a designed pattern (including a method of shifting an edge portion of the designed pattern and a method of providing a dummy pattern in the vicinity of the designed pattern) and a method of controlling a dosage of an electron beam used for electron beam exposure. Further, the method of correction with regard to the optical proximity effect includes a method of modifying the shape of a designed pattern and a method of providing a dummy pattern in the vicinity of the designed pattern.

Further, as a method of correction with regard to the proximity effect, for example, there may be employed the method disclosed in Japanese Patent Application No. 196898/1995 filed Aug. 1, 1995 (JP-A-45600/1997, and corresponding to U.S. patent application Ser. No. 08/681524). In the method disclosed in the above Japanese Laid-open Patent Publication, for the correction with regard to the proximity effect, a designed pattern is divided on the basis of a mesh size corresponding to a range where electrons are scattered in electron beam exposure, and meshed data are mesh-registered. And, some central mesh is taken up, and meshes including meshes around the central mesh are searched, to determine whether or not another designed pattern is registered around the designed pattern registered in the central mesh. When another designed pattern is present around, it is judged that the inter proximity effect takes place in the electron beam exposure, and that portion of the designed pattern registered in the central mesh where the inter proximity effect takes place is fragmented. And, optimum dosages are assigned to the fragmented portions of the designed pattern. On the other hand, when no designed pattern is present around, it is judged that the intra proximity effect takes place in the electron beam exposure, and that portion of the designed pattern registered in the central mesh where the intra proximity effect takes place is fragmented. And, optimum dosages are assigned to the fragmented portions of the designed pattern.

Further, for the correction with regard to the optical proximity effect, a designed pattern is divided on the basis of a mesh size determined by taking into account the optical proximity effect which takes place in optical exposure, and meshed data are mesh-registered. And, some central mesh is taken up, and meshes including meshes around the central mesh are searched, to determine whether or not another pattern is registered around the designed pattern registered in the central mesh. When another designed pattern is present around, it is judged that the inter optical proximity effect takes place in the optical exposure, and that portion of the designed pattern registered in the central mesh where the inter optical proximity effect takes place is fragmented. The fragmented designed pattern portion is modified in shape. On the other hand, when no designed pattern is present around, it is judged that the intra optical proximity effect takes place in the optical exposure, and that portion of the designed pattern registered in the central mesh where the intra optical proximity effect takes place is fragmented. The fragmented designed pattern portion is modified in shape. The fragmented designed pattern portion is modified in shape such that, for example, the shape of a resist pattern is close to the shape of the designed pattern.

As explained above, the dosages in some portions of a designed pattern are changed, or some portions of a designed pattern are modified in shape, whereby an increase in the number of patterns, an increase in the calculation time and an increase in the file size (data volume) of the corrected designed-pattern data can be prevented. In the method disclosed in the above Japanese Laid-open Patent Publication, for example, the mesh size to which a designed pattern is to be divided is made equal to an m-th grid size, and the hierarchical-area-bitmapping procedure in the present invention is carried out, whereby the step of taking up some central mesh and searching meshes including meshes around the central mesh to determine whether or not another designed pattern is registered around the designed pattern registered in the central mesh can be carried out at a high speed. And, the line width and the space width of the designed pattern are determined on the basis of the bitmap data. When the space width is smaller than the mesh size to which the designed pattern is to be divided, it is required to make corrections with regard to the proximity effect and/or the optical proximity effect. Therefore, the designed-pattern data can be corrected on the basis of the obtained line width and space width of the designed pattern.

[Step-130]

Then, the pattern data for electron beam exposure is produced from the corrected designed-pattern data. The pattern data for electron beam exposure can be produced by a known method, although the production method differs depending upon an electron beam exposure apparatus according to a raster scanning method or a vector scanning method. That is, for example, the corrected designed-pattern data of EB data format is converted to data for electron beam deflection (corresponding to pattern data for electron beam exposure) with the electron beam exposure apparatus to vary an aperture, whereby the exposure with an electron beam in a shape identical to the designed pattern can be carried out.

According to the above method of correcting designed-pattern data in Example 1, when designed patterns of a semiconductor device for one chip as whole are searched, it is no longer necessary to determine whether or not the designed patterns overlap or contact even if the designed-pattern data is of stream format. Further, when EB data format is used, pattern fracturing or field partition is present. However, by the hierarchical-area-bitmapping of the designed-pattern data, it is no longer necessary to take the pattern fracturing or field partition into account, and unlike a prior art, it is no longer necessary to bitmap all designed patterns on the basis of a minimum grid size. Therefore, the file size (data volume) of the bitmap data decreases, and the designed patterns in one chip as a whole are searched at a practical speed to determine the line width and the space width of the designed pattern. Further, an overhead between the graphic operation and the correction with regard to the proximity effect or the optical proximity effect can be decreased.

Figure 4:
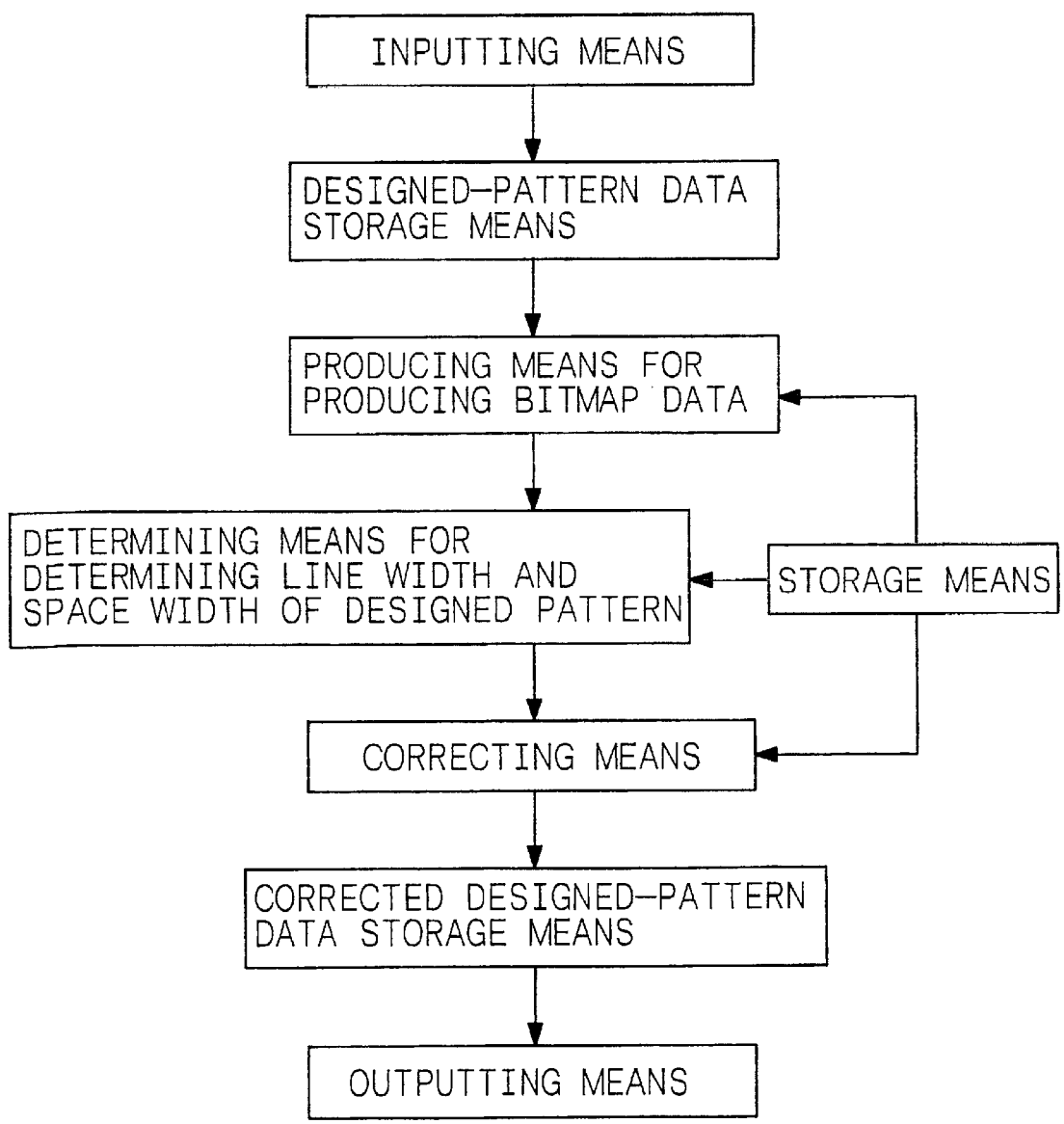
FIG. 4 shows a conceptual chart of the apparatus for correcting designed-pattern data, provided by the present invention.

FIG. 4 shows a conceptual chart of an apparatus for correcting designed-pattern data, provided by the present invention. The above apparatus is for correcting designed-pattern data obtained by data-processing a plurality of designed patterns. The apparatus comprises inputting means for inputting the designed-pattern data, producing means for producing bitmap data, determining means for determining a line width of the designed pattern and a space width between said designed pattern and a designed pattern adjacent to said designed pattern, correcting means for correcting the designed-pattern data for proximity effect correction and/or optical proximity effect correction, and outputting means for outputting the corrected designed-pattern data.

The inputting means may be any means so long as it can designate or input the designed-pattern data to the apparatus for correcting designed-pattern data, and it includes a keyboard and a touch panel. When the designed-pattern data stored in a storage medium such as a floppy disk is inputted to the apparatus for correcting designed-pattern data, or when the designed-pattern data stored in other data processing device is inputted to the apparatus for correcting designed-pattern data, the inputting means may be a hard disk or the like which receives the above designed-pattern data and store them. Further, when the designed-pattern data is inputted in the form of an electric signal, the inputting means may be an input terminal. The outputting means may be an output terminal for outputting the designed-pattern data corrected with regard to the proximity effect and/or the optical proximity effect. Otherwise, it may be a printer or an X-Y plotter for recording the designed patterns corrected with regard to the proximity effect and/or the optical proximity effect on a medium such as paper or a film, on the basis of the corrected designed-pattern data.

The producing means is for producing hierarchical-area-bitmapped bitmap data from the designed-pattern data. The determining means is for determining a line width of the designed pattern and a space width of the designed pattern between the designed pattern and another designed pattern adjacent thereto on the basis of the above hierarchical-area-bitmapped bitmap data. Further, the correcting means is for correcting the designed-pattern data on the basis of the determined line width and space width of the designed pattern for the proximity effect correction and/or the optical proximity effect correction. The producing means, the determining and the correcting means can be constituted of storage means such as RAM, ROM or an optical storage medium and a CPU. The above producing means may be for (A) bitmapping the designed-pattern data concerning a predetermined area including the deigned pattern, on the basis of a first grid size, to produce a bitmap data on a first grid size level, and (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 ... M, M is a minimum grid size representing coordinate value, and an (m+1)-th grid size is smaller than an m-th grid size, and it may be for repeating the step (B) by incrementing m by 1 until the bitmap data obtained on the basis of the (m+1)-th grid size represents the coordinate value expressing the edge of the designed pattern. The operation of each of the above means is substantially the same as that explained in the above method of correcting designed-pattern data, and detailed explanations thereof are therefore omitted.

Preferably, the above apparatus for correcting designed-pattern data is further provided with storage means. The storage means stores a program for producing the bitmap data, a program for determining line widths and space widths of the designed patterns, a program for correction with regard to the proximity effect and/or the optical proximity effect, various tables and various rules. The apparatus for correcting designed-pattern data may be further provided with storage means of storing the inputted designed-pattern data (designed-pattern data storage means) and storage means of storing the corrected designed-pattern data (corrected designed-pattern data storage means). The above designed-pattern data storage means and corrected designed-pattern data storage means may be constituted of a memory such as RAM or a hard disk. Further, the apparatus for correcting designed-pattern data may further have light intensity simulation means constituted of a CPU, etc., and may be structured such that the designed patterns can be corrected on the basis of determined line widths and space widths of the designed patterns with regard to the optical proximity effect, to obtain the designed-pattern data corrected with regard to the optical proximity effect.

The apparatus for correcting designed-pattern data may be built in an apparatus for producing designed-pattern data or an electron beam exposure apparatus, or it may be an apparatus independent of these apparatus.

EXAMPLE 2

Example 2 is concerned with the method of electron beam exposure, the photomask and the method of fabrication of the photomask, provided by the present invention. That is, concerning the method of electron beam exposure, for example, designed-pattern data obtained by data-processing a plurality of designed patterns for the fabrication of a semiconductor device are corrected, and an electron beam resist formed on a substrate is exposed with an electron beam on the basis of pattern data for electron beam exposure produced from the corrected designed-pattern data. The substrate used in Example 2 is a mask blank. Concerning the photomask and the method of fabrication of the photomask, then, an etching mask obtained by developing the electron beam resist is used for etching a mask blank. Designed-pattern data is corrected according to the method of correcting designed-pattern data, provided by the present invention, including the hierarchical-area-bitmapping procedure explained in Example 1.

Figure 5A:
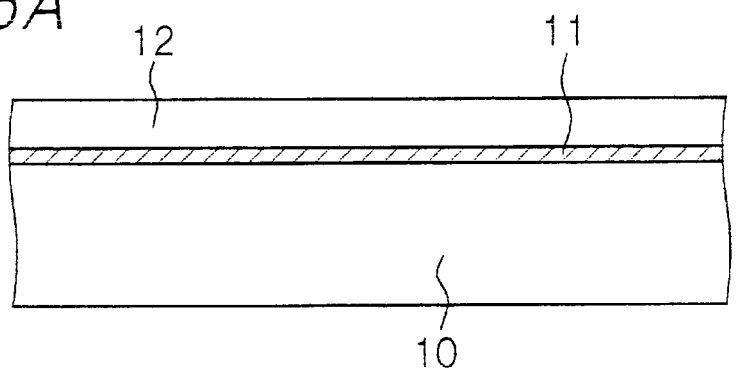
FIGS. 5A, 5B, 5C and 5D are schematic partial cross-sectional views of a mask blank, etc., for explaining Example 2.
Figure 5B:
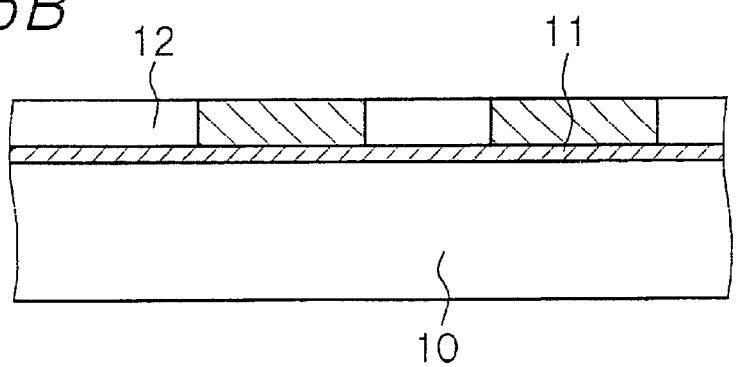

Specifically, Example 2 used, as a substrate, a mask blank prepared by forming a light-shielding thin layer 11 of metal on the surface of a glass plate 10 transparent to exposure light, as shown in the schematic partial cross-sectional view in FIG. 5A. However, the substrate shall not be limited to the above mask blank. Then, an electron beam resist 12, e.g., of a positive type is applied onto the light-shielding thin layer 11, and the electron beam resist 12 is exposed with an electron beam on the basis of the pattern data for electron beam exposure prepared in the same manner as in Example 1. This state is shown in FIG. 5B, in which those portions of the electron beam resist 12 which are indicated by slanting lines are portions exposed with the electron beam.

Figure 5C:
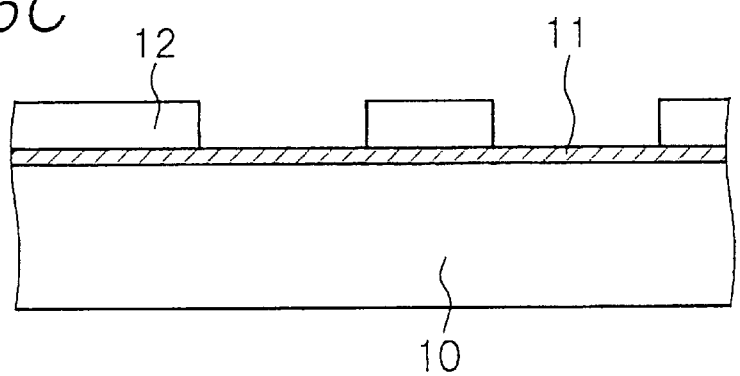
Figure 5D:
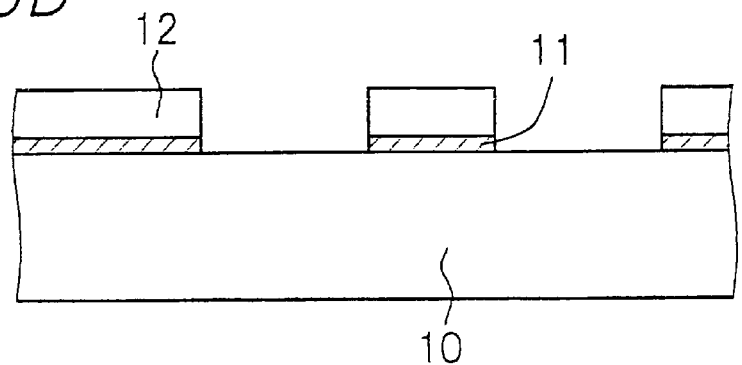

Then, the electron beam resist 12 is developed (see FIG. 5C) and then, the mask blank, more specifically, the light-shielding thin layer 11 is etched with an etching mask formed of the patterned electron beam resist 12, whereby a photomask (master mask) having a structure shown in FIG. 5D can be fabricated.

EXAMPLE 3

Figure 6A:
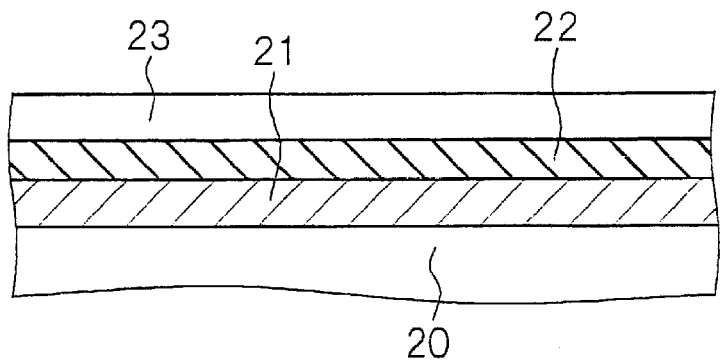
FIGS. 6A, 6B, 6C and 6D are schematic partial cross-sectional views of a semiconductor substrate, etc., for explaining Example 3.
Figure 6B:
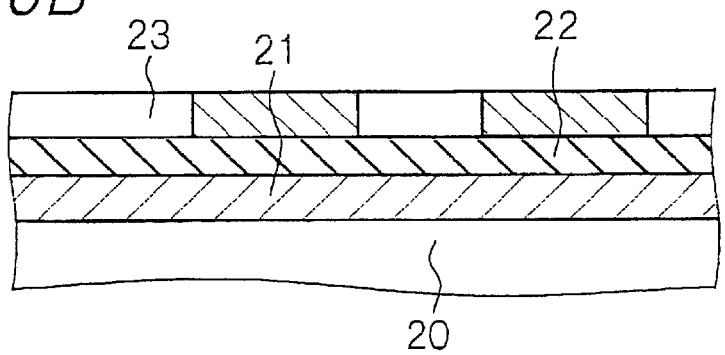

Example 3 is also concerned with the method of electron beam exposure, more specifically, with the method of electron beam exposure in which an electron beam resist formed on a substrate is directly exposed with an electron beam. In Example 3, the substrate is constituted of a metal layer 22 of an aluminum alloy formed above a semiconductor substrate 20 as shown in a schematic partial cross-sectional view in FIG. 6A, while the substrate shall not be limited to the above structure. Numeral 21 indicates an insulation interlayer formed on the semiconductor substrate 20. Concerning the method of electron beam exposure in Example 3, designed-pattern data obtained by data-processing a plurality of designed patterns, e.g., for the fabrication of a semiconductor device are corrected, and an electron beam resist 23 formed on the metal layer 22 as a substrate is exposed with an electron beam on the basis of the pattern data for electron beam exposure prepared on the basis of the corrected designed-pattern data. This state is shown in FIG. 6B, in which those portions of the electron beam resist 23 which are indicated by slanting lines are portions exposed with the electron beam. The designed-pattern data are corrected according to the method of correcting designed-pattern data, provided by the present invention, including the hierarchical-area-bitmapping procedure explained in Example 1.

Figure 6C:
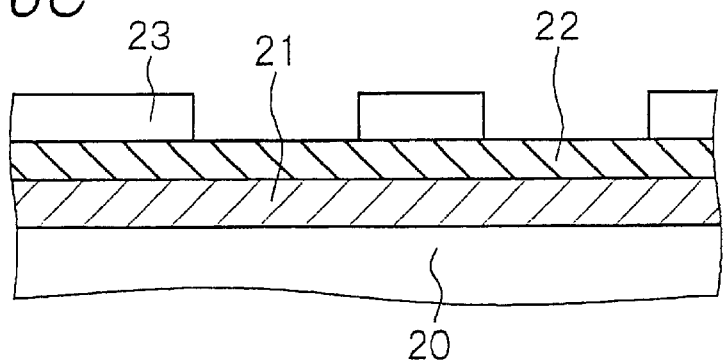
Figure 6D:
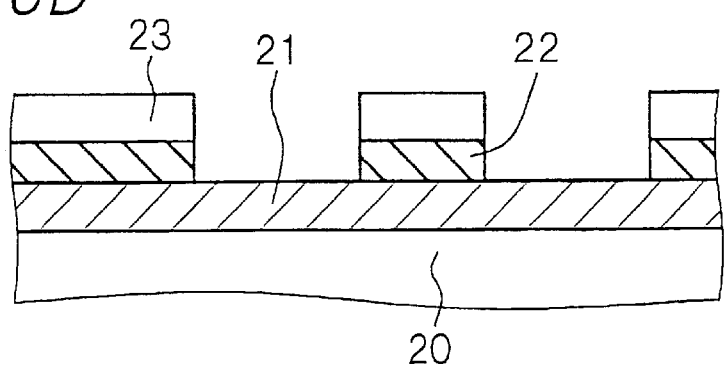

Then, the electron beam resist 23 is developed (see FIG. 6C) and then, the substrate, more specifically, the metal layer 22 is etched with an etching mask formed of the patterned electron beam resist 23, whereby a structure shown in FIG. 6D can be fabricated.

EXAMPLE 4

Example 4 is concerned with the method of optical exposure, the semiconductor device and the method of fabrication of the semiconductor device, provided by the present invention. That is, concerning the method of optical exposure, for example, designed-pattern data obtained by data-processing a plurality of designed patterns is corrected, and an electron beam resist formed on a mask blank is exposed with an electron beam on the basis of the pattern data for electron beam exposure prepared from the corrected designed-pattern data. Then, the above electron beam resist is developed to obtain an etching mask, and the mask blank is etched with the etching mask to fabricate the photomask. The photomask provided by the present invention is used in the method of optical exposure. That is, a photo resist formed on a substrate is exposed with exposure light to transfer a pattern formed on the photomask to the photo resist formed on the substrate. Concerning the semiconductor device and the method of fabrication thereof, after the transfer of the pattern formed on the photomask to the photo resist formed on the substrate, the photo resist is developed to obtain an etching mask, and the etching mask is used for etching the substrate. The designed-pattern data are corrected according to the method of correcting designed-pattern data, provided by the present invention, including the hierarchical-area-bitmapping procedure explained in Example 1.

Figure 7A:
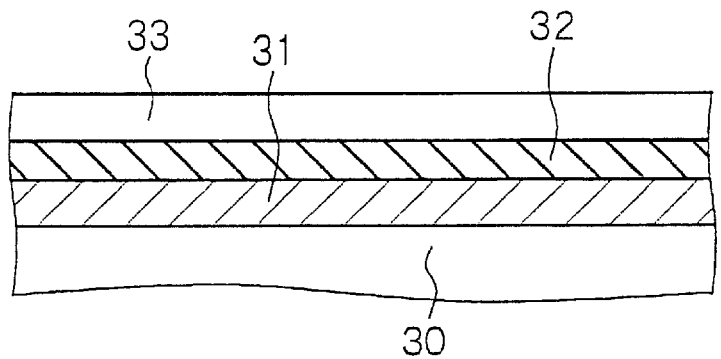
FIGS. 7A, 7B and 7C are schematic partial cross-sectional views of a semiconductor substrate, etc., for explaining Example 4.
Figure 7B:
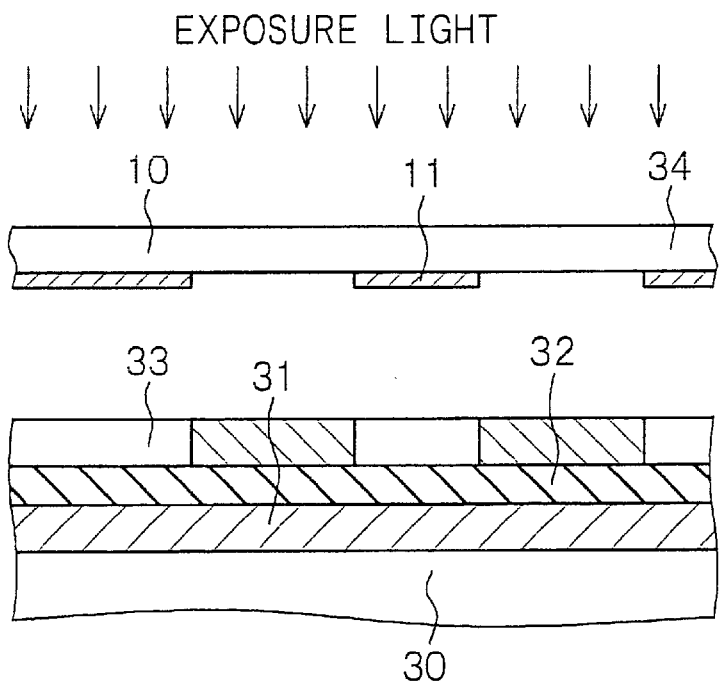

In Example 4, specifically, the substrate is constituted of a metal layer 32 of an aluminum alloy formed above a semiconductor substrate 30 as shown in a schematic partial cross-sectional view in FIG. 7A, while the substrate shall not be limited thereto. Numeral 31 indicates an insulation interlayer formed on the semiconductor substrate 30. And, a photo resist 33, e.g., of a positive type is applied onto the metal layer 32. In addition, there is used a photomask 34 fabricated by exposing an electron beam resist formed on a mask blank with an electron beam on the basis of the pattern data for electron beam exposure prepared in the same manner as in Example 1, then developing the electron beam resist to obtain an etching mask and etching the mask blank with the etching mask. And, the photo resist 33 is exposed with exposure light to transfer the mask patterns formed on the photomask 34 to the photo resist 33 formed on the metal layer 32 as a substrate. This state is shown in FIG. 7B, in which those portions of the photo resist 33 which are indicated by slanting lines are pattern-transferred portions.

Figure 7C:
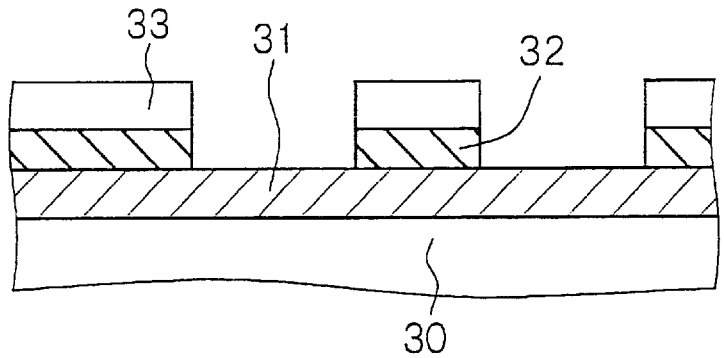

Then, the photo resist 33 is developed, and then the substrate, more specifically, the metal layer 32 is etched with an etching mask formed of the patterned photo resist 33, whereby a semiconductor device having a structure shown in FIG. 7C can be obtained.

Figure 8:
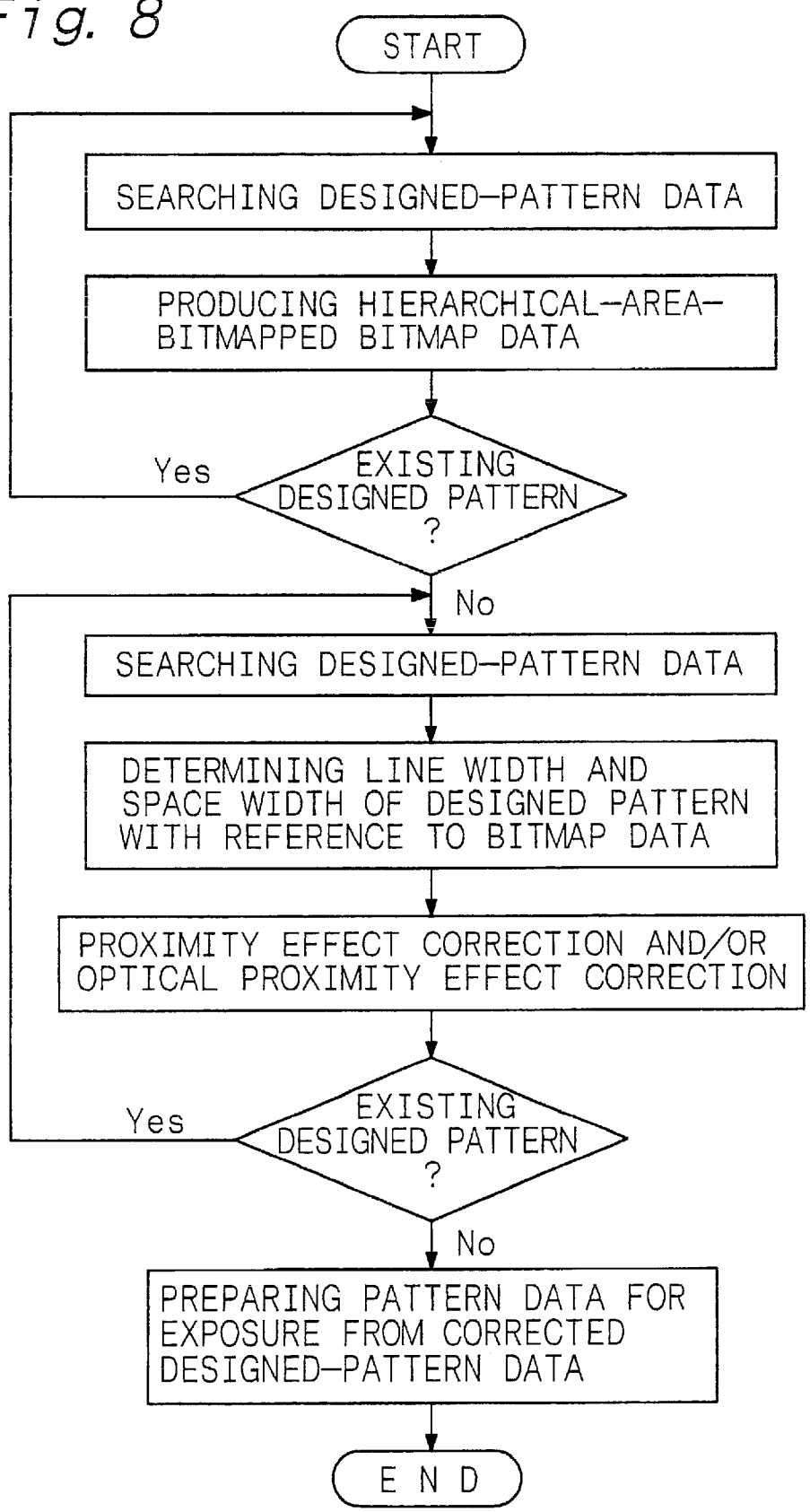
FIG. 8 is a flow chart which includes the method of correcting designed-pattern data, provided by the present invention, and shows the preparation of pattern data for electron beam exposure from the designed-pattern data.

The present invention has been explained with reference to Examples hereinabove, while the present invention shall not be limited thereto. The materials and various conditions used in Examples are for explanation purpose, and can be modified as required. Further, the steps of the method of correcting designed-pattern data in the present invention, explained in Example 1, can be also modified. For example, as shown in FIG. 8, the designed-pattern data are searched, hierarchical-area-bitmapping is carried out, and the hierarchical-area-bitmapping of all the designed-pattern data is completed. Then, the designed-pattern data are again searched, and in this case, a line width and a space width of the designed pattern are determined with reference to the bitmap data obtained by the hierarchical-area-bitmapping. On the basis of this, corrections can be made with regard to the proximity effect and/or the optical proximity effect. And, the pattern data for electron beam exposure is prepared from the corrected designed-pattern data. Alternatively, in some cases, while the designed-pattern data is corrected, the pattern data for electron beam exposure is prepared directly from the corrected designed-pattern data, and the exposure with an electron beam can be carried out on the basis of the pattern data for electron beam exposure.

Essentially, the hierarchical-area-bitmapping in the present invention may use any algorithm. The important point is that any algorithm is included in the hierarchical-area bitmapping in the present invention so long as it can give a hierarchical-area-bitmapped bitmap data which are obtained by bitmapping the designed-pattern data concerning a predetermined area including the designed pattern on the basis of an m-th grid size and are constituted of bitmap data including bitmap data representing coordinate value of an edge of the designed pattern, where m=1, 2, 3 . . . M, M is a minimum grid size representing coordinate value, and an (m+1)-th grid size is smaller than an m-th grid size.

Figure 9:
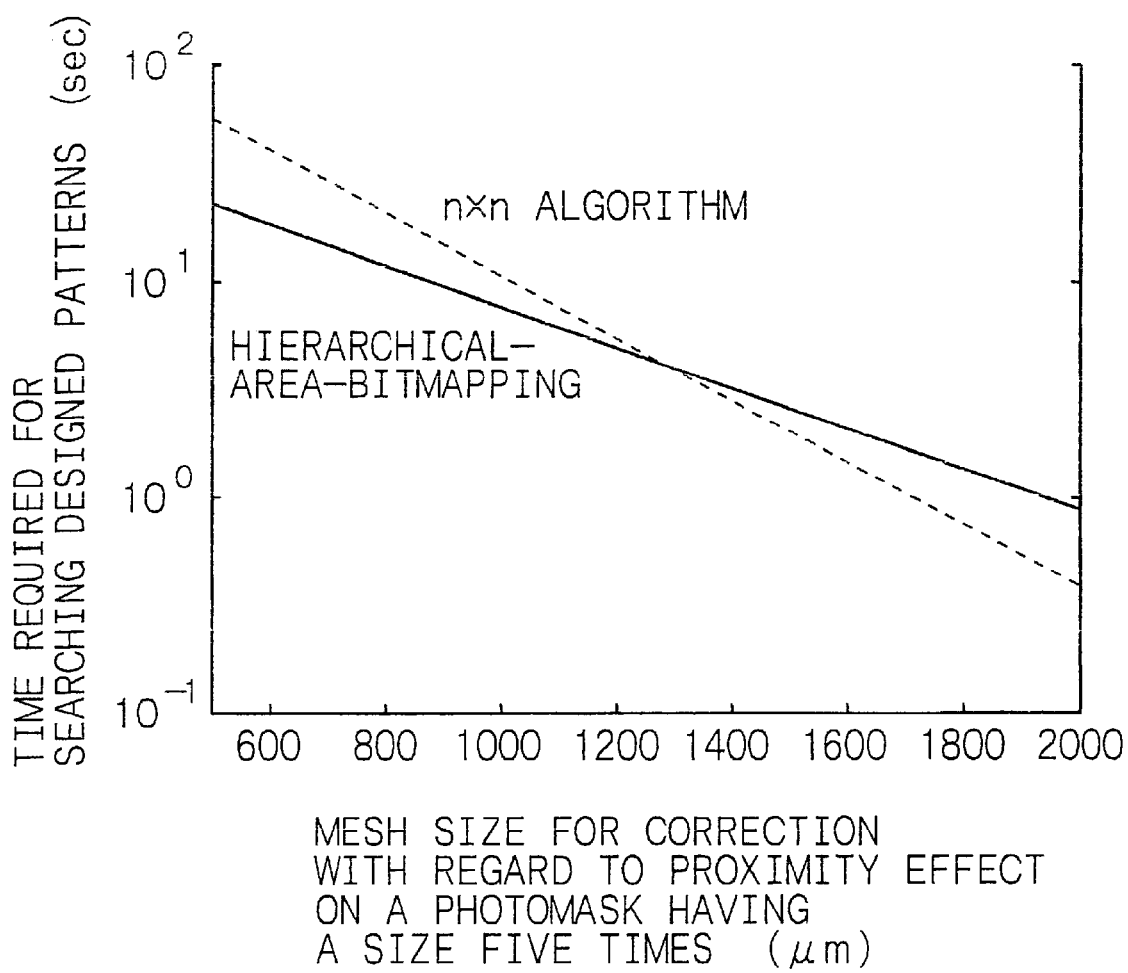
FIG. 9 is a graph showing a relationship between a mesh size and the time required for correction with regard to the proximity effect on a photomask having a size five times, when the hierarchical-area-bitmapping in the present invention and n×n algorithm are employed.
Figure 10A:
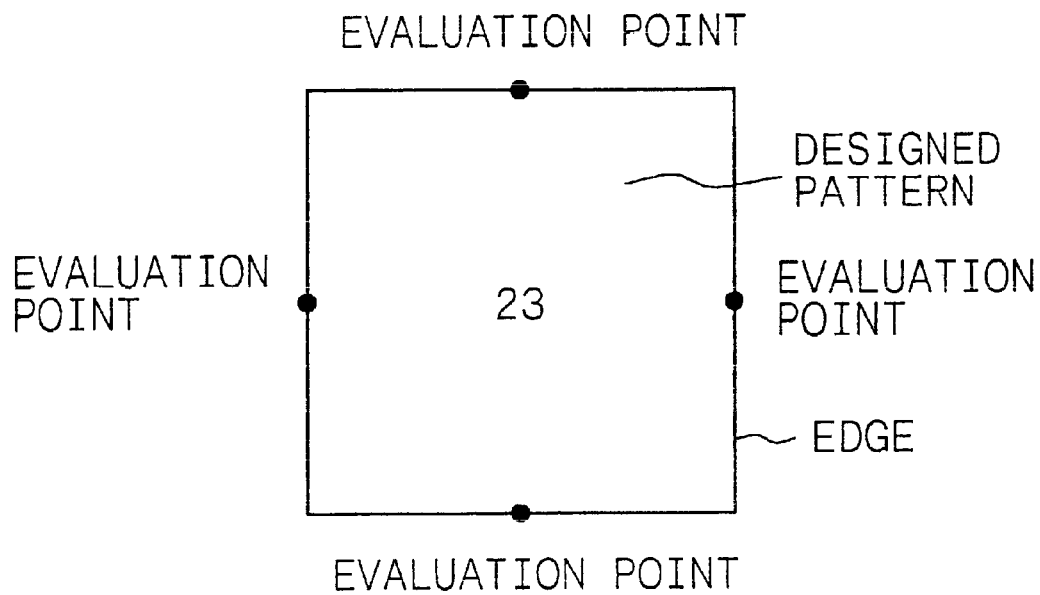
FIGS. 10A and 10B schematically show designed patterns for explaining the conventional method of the proximity effect correction.
Figure 10B:
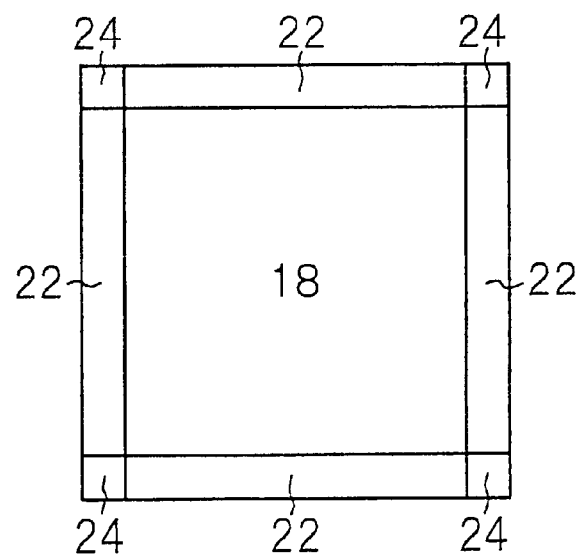
Figure 11:
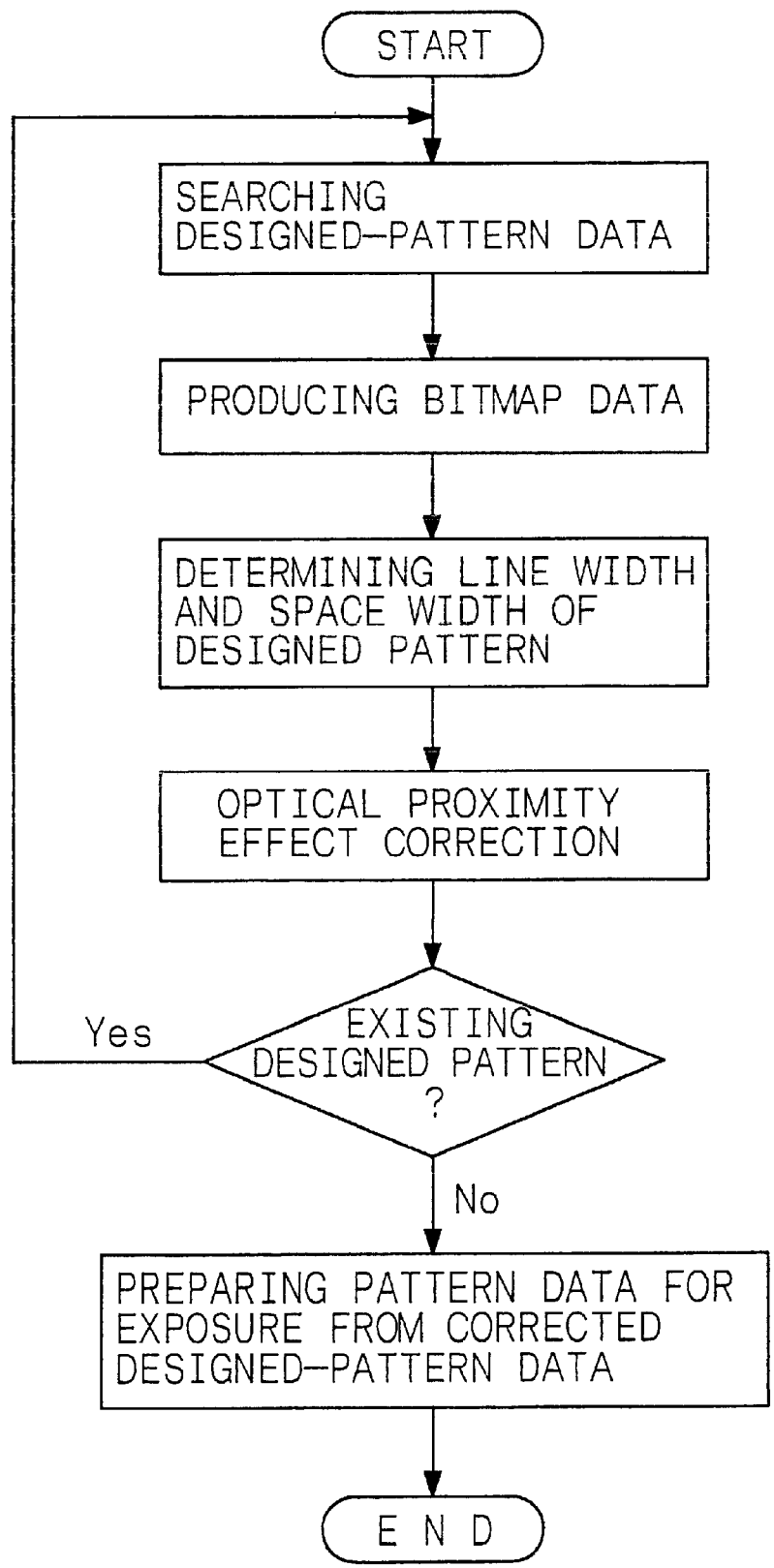
FIG. 11 is a flow chart example which includes the conventional correction of designed-pattern data with regard to the optical proximity effect and shows the preparation of pattern data for electron beam exposure from the designed-pattern data when the designed-pattern data is of stream format.
Figure 12A:
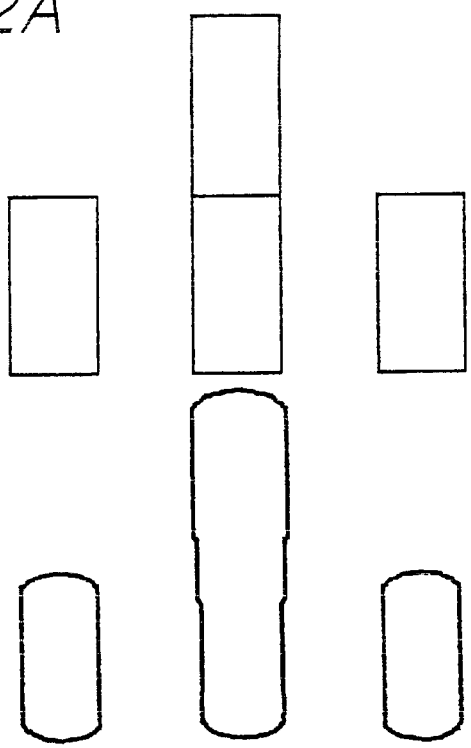
FIGS. 12A and 12B schematically show results of studies of an influence of the optical proximity effect by a light intensity simulation, depending upon the density of designed patterns.
Figure 12B:
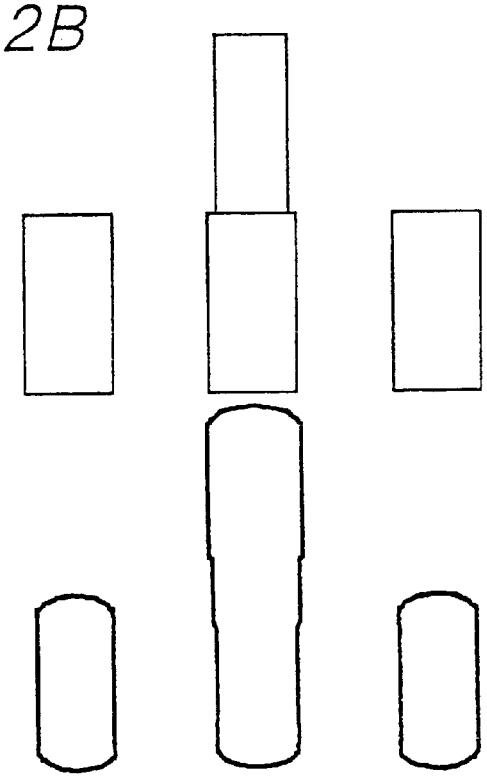
Figure 13A:
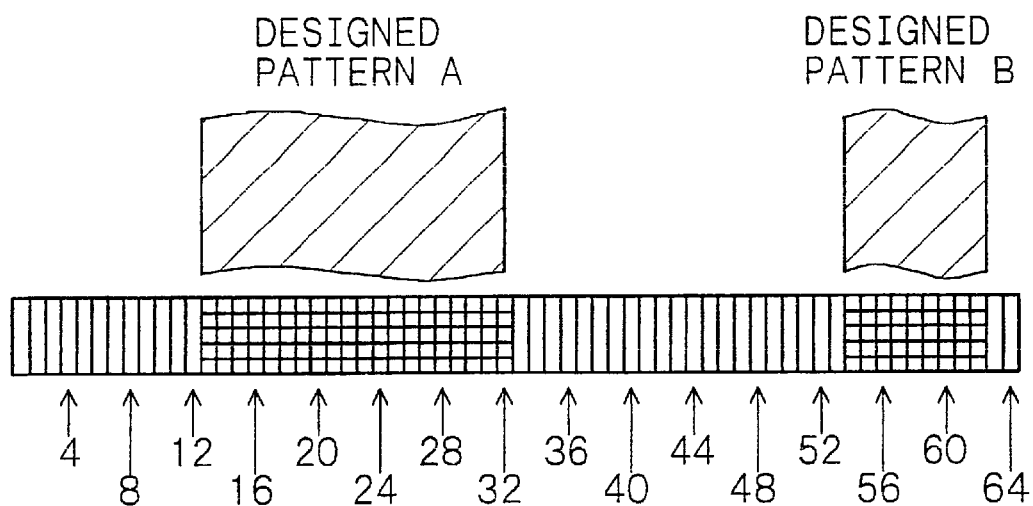
FIGS. 13A and 13B schematically show designed patterns and bitmap data for explaining a conventional area-bitmap method.
Figure 13B:
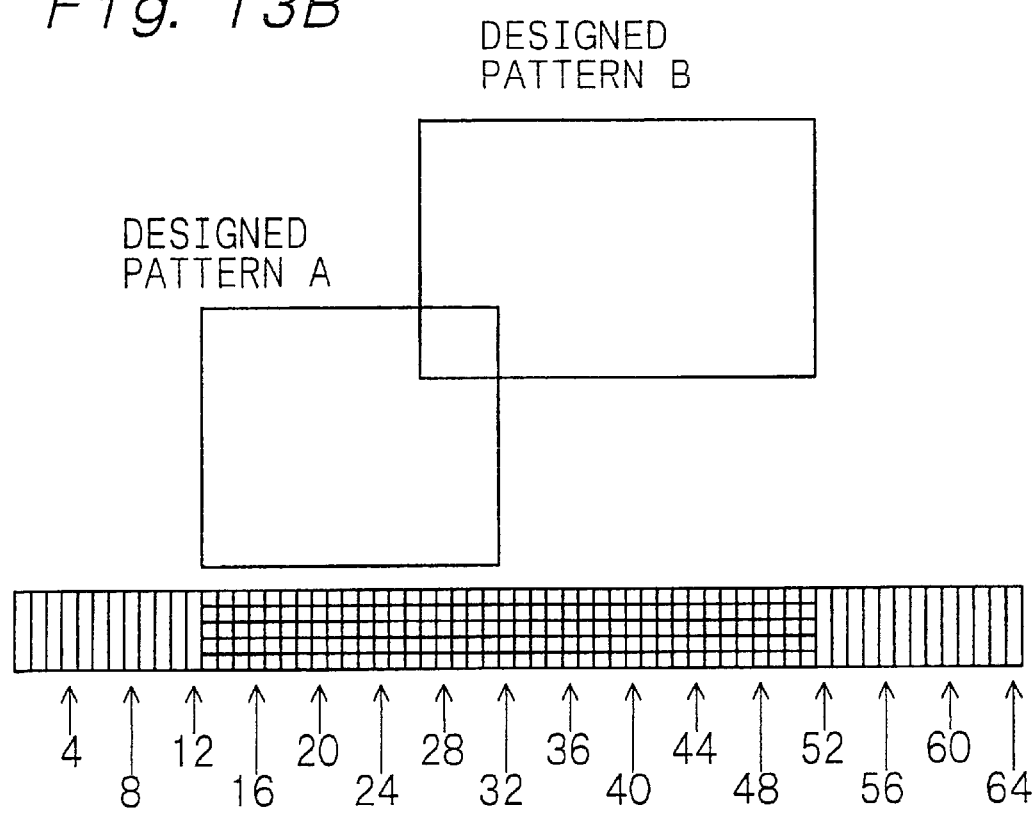

When designed patterns have a low density and when the number n of the designed patterns is very small, a designed pattern adjacent to one designed pattern may be simply searched, and a line width of the one designed pattern and a space width between the one designed pattern and another designed pattern adjacent to the one designed pattern may be operated. In this case, the time required for searching designed patterns to be corrected with regard to the proximity effect and/or the optical proximity effect is sometimes shorter. The above algorithm for searching the designed patterns to be corrected is called "n×n algorithm" for the convenience. FIG. 9 shows a relationship between mesh sizes (on a five times photomask) to which designed patterns are divided for correction with regard to the proximity effect and the time required for the correction with regard to the proximity effect. As the mesh decreases in size, the designed patterns are divided to small meshes, and the number n of the designed patterns which are divided to meshes increases. In the n×n algorithm, therefore, the time required for the correction with regard to the proximity effect increases. On the other hand, when the hierarchical-area-bitmapping is carried out, the increase ratio of the time required for the correction with the proximity effect is smaller than that in the n×n algorithm even if the mesh size is decreased. Therefore, experiments, simulations, etc., may be used to determine a relationship among the density of designed patterns, the size of meshes, the time required for correction with regard to the proximity effect in the n×n algorithm and the time required for correction with regard to the proximity effect in the hierarchical-area-bitmapping, and it may be decided which method should be employed, on the basis of the density of designed patterns. In this case, an average designed pattern density in one chip may be used to decide which method should be employed, or the hierarchical-area-bitmapping may be applied to a region having a higher designed pattern density in one chip and the n×n algorithm may be applied to a region having a lower designed pattern density.

Example 1 explains an embodiment in which M=3, while the present invention shall not be limited to such a value of M. When the M-th grid size is, e.g., 16 nm, when the value of [m-th grid size]/[(m+1)-th grid size] is 16 and when M=6, each grid size is as shown in Table 4. However, the grid sizes in the hierarchical-area-bitmapping in the present invention shall not be limited to the values in Table 4.

TABLE 4

| | |
|---|---|
| First grid size: | about 16 mm ($16^6$ nm) |
| Second grid size: | about 1 mm ($16^5$ nm) |
| Third grid size: | about 65 μm ($16^4$ nm) |
| Fourth grid size: | about 4 μm ($16^3$ nm) |
| Fifth grid size: | 256 nm ($16^2$ nm) |
| Sixth grid size: | 16 nm |

According to the present invention, when designed patterns, e.g., for a semiconductor device are searched for one chip as a whole, the file size (data volume) of bitmap data is small due to the hierarchical-area-bitmapping, and as a result, the designed patterns for one chip as a whole can be searched at a practical speed to determine the line widths and space widths of the designed patterns. Therefore, nano-processing can be carried out without causing a decrease in the throughput in the fabrication of a photomask or a semiconductor device.

What is claimed is:

1. A method for correcting designed-pattern data obtained by data-processing a plurality of designed patterns, comprising the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

2. The method according to claim 1, wherein the hierarchical-area-bitmapping procedure in the step (a) includes;

(A) bitmapping the designed-pattern data concerning a predetermined area including the designed pattern, on the basis of a first grid size, to produce a bitmap data on a first grid size level, and (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

3. A method of electron beam exposure comprising the steps of;

correcting designed-pattern data obtained by data-processing a plurality of designed patterns, preparing pattern data for electron beam exposure from the corrected designed-pattern data, and exposing an electron beam resist formed on a substrate with an electron beam on the basis of the obtained pattern data for electron beam exposure, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

4. The method according to claim 3, wherein the hierarchical-area-bitmapping procedure in the step (a) includes;

(A) bitmapping the designed-pattern data concerning a predetermined area including the deigned pattern, on the basis of a first grid size, to produce a bitmap data on a first grid size level, and (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

5. A method of fabrication of a photomask comprising the steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;

(a) producing hierarchical-area-bitmapped bitmap data from a plurality of the designed-pattern data, (b) determining a line width of the designed pattern and a space width between said designed pattern and a designed pattern adjacent to said designed pattern, from said hierarchical-area-bitmapped bitmap data, and (c) correcting the designed-pattern data on the basis of the determined line width and the determined space width, for proximity effect correction and/or optical proximity effect correction.

6. The method according to claim 5, wherein the hierarchical-area-bitmapping procedure in the step (a) includes;

(A) bitmapping the designed-pattern data concerning a predetermined area including the designed pattern, on the basis of a first grid size, to produce a bitmap data on a first grid size level, and (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

7. A photomask obtained by the fabricating steps of;

correcting designed-pattern data obtained by data-processing a plurality of designed patterns, preparing pattern data for electron beam exposure from the corrected designed-pattern data, exposing an electron beam resist formed on a mask blank with an electron beam on the basis of the obtained pattern data for electron beam exposure, forming an etching mask by developing the electron beam resist, and etching the mask blank with the etching mask, wherein the correction of the designed-pattern data comprises the steps of;
- (a) producing hierarchical-area-bitmapped bitmap data from a plurality of the designed-pattern data,
- (b) determining a line width of the designed pattern and a space width between said designed pattern and a designed pattern adjacent to said designed pattern, from said hierarchical-area-bitmapped bitmap data, and
- (c) correcting the designed-pattern data on the basis of the determined line width and the determined space width, for proximity effect correction and/or optical proximity effect correction.

8. The photomask according to claim 7, wherein the hierarchical-area-bitmapping procedure in the step (a) includes;
- (A) bitmapping the designed-pattern data concerning a predetermined area including the designed pattern, on the basis of a first grid size, to produce a bitmap data on a first grid size level, and
- (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

9. A method of optical exposure comprising the step of exposing a photo resist formed on a substrate through a photomask with exposure light to transfer a pattern formed in the photomask to the photo resist formed on the substrate, said photomask obtained by the fabricating steps of;
correcting designed-pattern data obtained by data-processing a plurality of designed patterns,
preparing pattern data for electron beam exposure from the corrected designed-pattern data,
exposing an electron beam resist formed on a mask blank with an electron beam on the basis of the obtained pattern data for electron beam exposure,
forming an etching mask by developing the electron beam resist, and
etching the mask blank with the etching mask,
wherein the correction of the designed-pattern data comprises the steps of;
- (a) producing hierarchical-area-bitmapped bitmap data from a plurality of the designed-pattern data,
- (b) determining a line width of the designed pattern and a space width between said designed pattern and a designed pattern adjacent to said designed pattern, from said hierarchical-area-bitmapped bitmap data, and
- (c) correcting the designed-pattern data on the basis of the determined line width and the determined space width, for proximity effect correction and/or optical proximity effect correction.

10. The method according to claim 9, wherein the hierarchical-area-bitmapping procedure in the step (a) includes;
- (A) bitmapping the designed-pattern data concerning a predetermined area including the designed pattern, on the basis of a first grid size, to produce a bitmap data on a first grid size level, and
- (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

11. A method of fabricating a semiconductor device comprising the steps of exposing a photo resist formed on a substrate through a photomask with exposure light to transfer a pattern formed in the photomask to the photo resist formed on the substrate, developing the photo resist to obtain an etching mask, and etching the substrate with the etching mask, said photomask obtained by the fabricating steps of;
correcting designed-pattern data obtained by data-processing a plurality of designed patterns,
preparing pattern data for electron beam exposure from the corrected designed-pattern data,
exposing an electron beam resist formed on a mask blank with an electron beam on the basis of the obtained pattern data for electron beam exposure,
forming an etching mask by developing the electron beam resist, and
etching the mask blank with the etching mask,
wherein the correction of the designed-pattern data comprises the steps of;
- (a) producing hierarchical-area-bitmapped bitmap data from a plurality of the designed-pattern data,
- (b) determining a line width of the designed pattern and a space width between said designed pattern and a designed pattern adjacent to said designed pattern, from said hierarchical-area-bitmapped bitmap data, and
- (c) correcting the designed-pattern data on the basis of the determined line width and the determined space width, for proximity effect correction and/or optical proximity effect correction.

12. The method according to claim 11, wherein the hierarchical-area-bitmapping procedure in the step (a) includes;
- (A) bitmapping the designed-pattern data concerning a predetermined area including the designed pattern, on the basis of a first grid size, to produce a bitmap data on a first grid size level, and
- (B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and repeating the step (B) by incrementing m by 1 until the bitmap data obtained on the basis of the (m+1)-th grid size represents the coordinate value expressing the edge of the designed pattern.

13. A semiconductor device obtained by the fabricating steps of exposing a photo resist formed on a substrate through a photomask with exposure light to transfer a pattern formed in the photomask to the photo resist formed on the substrate, developing the photo resist to obtain an etching mask, and etching the substrate with the etching mask, said photomask obtained by the fabricating steps of;
correcting designed-pattern data obtained by data-processing a plurality of designed patterns,
preparing pattern data for electron beam exposure from the corrected designed-pattern data,
exposing an electron beam resist formed on a mask blank with an electron beam on the basis of the obtained pattern data for electron beam exposure,
forming an etching mask by developing the electron beam resist, and
etching the mask blank with the etching mask,
wherein the correction of the designed-pattern data comprises the steps of;
(a) producing hierarchical-area-bitmapped bitmap data from a plurality of the designed-pattern data,
(b) determining a line width of the designed pattern and a space width between said designed pattern and a designed pattern adjacent to said designed pattern, from said hierarchical-area-bitmapped bitmap data, and
(c) correcting the designed-pattern data on the basis of the determined line width and the determined space width, for proximity effect correction and/or optical proximity effect correction.

14. The semiconductor device according to claim 13, wherein the hierarchical-area-bitmapping procedure in the step (a) includes;
(A) bitmapping the designed-pattern data concerning a predetermined area including the designed pattern, on the basis of a first grid size, to produce a bitmap data on a first grid size level, and
(B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and
repeating the step (B) by incrementing m by 1 until the bitmap data obtained on the basis of the (m+1)-th grid size represents the coordinate value expressing the edge of the designed pattern.

15. An apparatus for correcting designed-pattern data obtained by data-processing a plurality of designed patterns, comprising;
(1) inputting means for inputting the designed-pattern data,
(2) producing means for producing bitmap data,
(3) determining means for determining a line width of the designed pattern and a space width between said designed pattern and a designed pattern adjacent to said designed pattern,
(4) correcting means for correcting the designed-pattern data, and
(5) outputting means for outputting the corrected designed-pattern data,
wherein said producing means is for producing hierarchical-area-bitmapped bitmap data from the designed-pattern data,
said determining means is for determining a line width of the designed pattern and a space width between the designed pattern and a designed pattern adjacent to said designed pattern on the basis of said hierarchical-area-bitmapped bitmap data, and
said correcting means is for correcting the designed-pattern data on the basis of the determined line width and the determined space width, for proximity effect correction and/or optical proximity effect correction.

16. The apparatus according to claim 15, wherein said producing means is for,
(A) bitmapping the designed-pattern data concerning a predetermined area including the designed pattern, on the basis of a first grid size, to produce a bitmap data on a first grid size level, and
(B) producing bitmap data on an (m+1)-th grid size level from a bitmap data on an m-th grid size level which includes an edge of the designed pattern and is included among a plurality of bitmap data obtained on the basis of an m-th grid size, where m=1, 2, 3 . . . M, M is a minimum grid size representing coordinate value, and an (m+1)-th grid size is smaller than an m-th grid size, and
repeating the step (B) by incrementing m by 1 until the bitmap data obtained on the basis of the (m+1)-th grid size represents the coordinate value expressing the edge of the designed pattern.

* * * * *

UNITED STATES PATENT AND TRADEMARK OFFICE
CERTIFICATE OF CORRECTION

PATENT NO.    : 6,370,441 B1
DATED         : April 9, 2002
INVENTOR(S)   : Hidetoshi Ohnuma It is certified that error appears in the above-identified patent and that said Letters Patent is hereby corrected as shown below:

Column 21,
Line 67, replace "deigned" with -- designed --.

Signed and Sealed this

Fourth Day of February, 2003

JAMES E. ROGAN
*Director of the United States Patent and Trademark Office*